United States Patent
Dodge et al.

(10) Patent No.: US 8,859,058 B2
(45) Date of Patent: Oct. 14, 2014

(54) MICROWAVE PLASMA REACTORS AND SUBSTRATES FOR SYNTHETIC DIAMOND MANUFACTURE

(75) Inventors: Carlton Nigel Dodge, Ballasalla (IM); Paul Nicolas Inglis, Ascot (GB); Geoffrey Alan Scarsbrook, Ascot (GB); Timothy Peter Mollart, Ascot (GB); Charles Simon James Pickles, Ascot (GB); Steven Edward Coe, Ascot (GB); Joseph Michael Dodson, Ascot (GB); Alexander Lamb Cullen, Ascot (GB); John Robert Brandon, Ascot (GB); Christopher John Howard Wort, Ascot (GB)

(73) Assignee: Element Six Limited, Ballasalla (IM)

( * ) Notice: Subject to any disclaimer, the term of this patent is extended or adjusted under 35 U.S.C. 154(b) by 0 days.

(21) Appl. No.: 13/994,813

(22) PCT Filed: Dec. 14, 2011

(86) PCT No.: PCT/EP2011/072818
§ 371 (c)(1),
(2), (4) Date: Nov. 14, 2013

(87) PCT Pub. No.: WO2012/084655
PCT Pub. Date: Jun. 28, 2012

(65) Prior Publication Data
US 2014/0234556 A1    Aug. 21, 2014

Related U.S. Application Data

(60) Provisional application No. 61/439,270, filed on Feb. 3, 2011.

(30) Foreign Application Priority Data

Dec. 23, 2010 (GB) .................................. 1021913.7

(51) Int. Cl.
| | |
|---|---|
| *C23C 16/00* | (2006.01) |
| *C23C 16/27* | (2006.01) |
| *C23C 16/52* | (2006.01) |
| *C23C 16/511* | (2006.01) |

(52) U.S. Cl.
CPC ............... *C23C 16/274* (2013.01); *C23C 16/52* (2013.01); *C23C 16/511* (2013.01)
USPC ........................................ 427/575; 427/249.8

(58) Field of Classification Search
CPC ............................. C23C 16/274; C23C 16/511
USPC .......................................................... 427/574
See application file for complete search history.

(56) References Cited

U.S. PATENT DOCUMENTS

| | | | |
|---|---|---|---|
| 4,869,923 | A | 9/1989 | Yamazaki |
| 4,989,542 | A | 2/1991 | Kamo |
| 5,091,208 | A | 2/1992 | Pryor |
| 5,258,206 | A | 11/1993 | Hayashi et al. |
| 5,261,959 | A | 11/1993 | Gasworth |
| 5,273,731 | A | 12/1993 | Anthony et al. |
| 5,273,790 | A | 12/1993 | Herb et al. |
| 5,302,226 | A | 4/1994 | Yamazaki et al. |
| 5,302,803 | A | 4/1994 | Stevens et al. |
| 5,311,103 | A | 5/1994 | Asmussen et al. |
| 5,397,396 | A | 3/1995 | Kosky et al. |
| 5,501,740 | A | 3/1996 | Besen et al. |
| 5,643,365 | A | 7/1997 | Blinov et al. |
| 5,683,759 | A | 11/1997 | Shepard, Jr. et al. |
| 5,981,057 | A | 11/1999 | Collins |
| 6,091,045 | A | 7/2000 | Mabuchi et al. |
| 6,106,678 | A | 8/2000 | Shufflebotham et al. |
| 6,158,383 | A | 12/2000 | Watanabe et al. |
| 6,254,683 | B1 | 7/2001 | Matsuda et al. |
| 6,319,439 | B1 | 11/2001 | Lee et al. |
| 6,325,018 | B1 | 12/2001 | Hongoh |
| 6,388,632 | B1 | 5/2002 | Murakawa et al. |
| 6,414,338 | B1 | 7/2002 | Anderson |
| 6,427,621 | B1 | 8/2002 | Ikegawa et al. |
| 6,433,298 | B1 | 8/2002 | Ishii |
| 6,487,986 | B1 | 12/2002 | Liehr et al. |
| 6,565,661 | B1 | 5/2003 | Nguyen |
| 6,645,343 | B1 | 11/2003 | Wild et al. |
| 2001/0023663 | A1 | 9/2001 | Kazumi et al. |
| 2001/0036465 | A1 | 11/2001 | Ishll et al. |

| | | | |
|---|---|---|---|
| 2003/0107003 | A1 | 6/2003 | Whitehead |
| 2003/0150561 | A1 | 8/2003 | Ishii et al. |
| 2003/0150846 | A1 | 8/2003 | Ishii et al. |
| 2003/0200914 | A1 | 10/2003 | Noguchi et al. |
| 2004/0045674 | A1 | 3/2004 | Ishii et al. |
| 2005/0005853 | A1 | 1/2005 | Behle et al. |
| 2005/0109267 | A1 | 5/2005 | Linares et al. |
| 2005/0266606 | A1 | 12/2005 | Chevallier et al. |
| 2006/0266279 | A1 | 11/2006 | Mokuno |
| 2007/0163996 | A1 | 7/2007 | Horiguchi |
| 2007/0221294 | A1 | 9/2007 | Sasaki |
| 2008/0099768 | A1 | 5/2008 | Scarsbrook et al. |
| 2008/0156256 | A1 | 7/2008 | Linares et al. |
| 2008/0190356 | A1 | 8/2008 | Bhandari |
| 2008/0303744 | A1 | 12/2008 | Hirayama et al. |
| 2010/0028556 | A1 | 2/2010 | Linares et al. |
| 2010/0034984 | A1 | 2/2010 | Asmussen et al. |
| 2010/0178234 | A1 | 7/2010 | Noguchi |
| 2010/0189924 | A1 | 7/2010 | D'Evelyn et al. |

FOREIGN PATENT DOCUMENTS

| | | | |
|---|---|---|---|
| CN | 101385129 | | 3/2009 |
| EP | 0343602 | A3 | 11/1989 |
| EP | 0390209 | A3 | 10/1990 |
| EP | 0447031 | A1 | 9/1991 |
| EP | 0480581 | | 9/1991 |
| EP | 0467043 | A2 | 1/1992 |
| EP | 0487292 | A1 | 5/1992 |
| EP | 0526657 | A1 | 2/1993 |
| EP | 0546752 | A1 | 6/1993 |
| EP | 0582397 | A2 | 2/1994 |
| EP | 0597445 | A2 | 5/1994 |
| EP | 0695816 | A1 | 2/1996 |
| EP | 0727507 | A2 | 8/1996 |
| EP | 0758688 | A1 | 2/1997 |
| EP | 0822269 | | 4/1998 |
| EP | 1500718 | A1 | 1/2005 |
| EP | 1643641 | A2 | 4/2006 |
| EP | 1463849 | | 1/2007 |
| EP | 2108714 | A1 | 10/2009 |
| FR | 2798552 | | 3/2001 |
| JP | S62162366 | A | 7/1987 |
| JP | S62167886 | A | 7/1987 |
| JP | S62235393 | A | 10/1987 |
| JP | 03281594 | C2 | 12/1991 |
| JP | 4009471 | A | 1/1992 |
| JP | 4-228495 | A | 8/1992 |
| JP | H04238896 | | 8/1992 |
| JP | H05013342 | A | 1/1993 |
| JP | H061251158 | A | 9/1994 |
| JP | H08133893 | A | 5/1996 |
| JP | 2001007385 | | 1/2001 |
| JP | 2002265296 | A | 3/2001 |
| JP | 2003045810 | A | 2/2003 |
| JP | 2003-142471 | A | 5/2003 |
| JP | 2004235434 | A | 8/2004 |
| JP | 2004244298 | A | 9/2004 |
| JP | 2005-044822 | A | 2/2005 |
| JP | 2007142195 | | 6/2007 |
| JP | 2007273913 | A | 10/2007 |
| JP | 2007284773 | A | 11/2007 |
| JP | 2007331955 | A | 12/2007 |
| JP | 2006286269 | A | 5/2008 |
| JP | 2009280421 | A | 12/2009 |
| KR | 20020061768 | A | 7/2002 |
| SE | 500740 | C2 | 8/1994 |
| WO | 02/077319 | A1 | 10/2002 |
| WO | 03/040440 | A2 | 5/2003 |
| WO | 2006/117621 | | 11/2006 |
| WO | 2006/127611 | A2 | 11/2006 |
| WO | 2007/092893 | A2 | 8/2007 |
| WO | 2008/025899 | | 3/2008 |
| WO | 2008/029258 | | 3/2008 |
| WO | 2008/090510 | | 7/2008 |
| WO | 2008/123605 | A1 | 10/2008 |
| WO | 2010/004836 | A1 | 1/2010 |
| WO | 2010/021382 | A1 | 2/2010 |
| WO | 2010/084655 | | 7/2010 |

OTHER PUBLICATIONS

Balmer et al., Chemical vapour deposition synthetic diamond: materials, technology and applications, Journal of Physics: Condensed Matter, 21, 2009.

Whitfield et al., Nucleation and growth of diamond films on single crystal and polycrystalline tungsten substrates, Diamond and Related Materials, vol. 9, pp. 262-268, 2000.

International Search Report issued on PCT/EP2011/072824, dated May 3, 2012.

Silva et al., Microwave Analysis of PACVD diamond deposition reactor based on electromagnetic materials, Diamond & Related Materials, vol. 19, pp. 397-403, 2010.

Search Report issued on GB1121517.5, dated Mar. 27, 2012.

Funer et al., Simulation and development of optimized microwave plasma reactors for diamond deposition, Surface and Coatings Technology, 1999, 853-862, vol. 116-119.

Hassouni et al., Self-consistent microwave field and plasma discharge simulations for a moderate pressure hydrogen discharge reactor, Journal of Applied Physics, 1999, pp. 134-151, 86(1).

Search Report issued on GB1021913.7, dated Apr. 21, 2011.

Kosky et al., Fracture-free release of CVD diamond, Diamond and Related Materials 5 (1996) pp. 1313-1317.

Asmussen, et al., Multiple substrate microwave plasma-assisted chemical vapor deposition single crystal diamond syntheses, Applied Physics Letters, p. 93, 031502, 2008.

Chae, et al., The 8-inch free-standing CVD diamond wafer fabricated by DC-PACVD, Diamond and Related Materials, 19, 2010, pp. 1168-1171.

Gray, et al., Free-standing CVD diamond wafers for thermal management by d.c. arc jet technology, Diamond and Related Materials 8, 1999, 903-908.

Liao, Samuel Y., Microwave Devices and Circuits, 3d Edition, published by Prentice-Hall, Inc., New Jersey pp. 144-156, 1996.

Hassouni et la., Modelling of diamond deposition microwave cavity generated plasmas, J. Phys. D. Appl. Phys,. 43 (2010) 153001.

Hemawan, et a., Improved microwave plasma cavity reactor for diamond synthesis at high-pressure and high power density, Diamond & Related Materials 19 (2010) 1446-1452.

Alam et al., Adhesion of diamond coatings on tungsten substrates, Journal of Adhesion Science and Technology, vol. 9, No. 6, 1995 Netherlands, 653-679.

Feng, et al., Surface stress measurement with interference microscopy of thick homoepitaxial single-crystal diamond layers, Diamond & Related Materials 19 (2010) 1453-1456.

Yamada, Simulation with an improved plasma model utilized to design a new structure of microwave plasma dischage for chemical vapor deposition of diamond crystals, Diamond and Related Materials, 17, Issues 4-5 (2008), pp. 494-497.

Achard, J., et al., Thick boron doped diamond single crystals for high power electronics, Diamond & Related Materials, 20, pp. 145-152, 2010.

Lee, et al., Single-cathode DC PACVD process for large-area CVD diamond wafer fabrication, 203rd Meeting of the Electrochemical Society, Eighth International Symposium on Diamond Materials, 2003.

Funer et al., Numerical simulations of microwave plasma reactor for diamond CVD, Surface and Coatings Technology, 74-75 (1995), pp. 221-226.

International Search Report issued on PCT/EP2011/072820, dated Mar. 30, 2012.

Search Report issued on GB1121474.9, dated Mar. 27, 2012.
Search Report issued on GB1305030.7 dated Apr. 16, 2013.
Search Report issued on GB1305041.4 dated Apr. 15, 2013.
Search Report issued on GB1305045.5 dated Apr. 16, 2013.
Search Report issued on GB1121486.3 dated Apr. 12, 2012.
Search Report issued on GB1021870.9 dated Apr. 6, 2011.
Search Report issued on GB1021865.9 dated Apr. 20, 2011.
Search Report issued on GB1121494.7 dated Apr. 7, 2012.
Search Report issued on GB1021860.0 dated Apr. 20, 2011.
Search Report issued on GB1121492.1 dated Apr. 12, 2012.
Search Report issued on GB1021855.0 dated May 31, 2011.
Search Report issued on GB1121499.6 dated Jan. 27, 2012.
Search Report issued on GB1121505.0 dated Mar. 29, 2012.

International Search Report issued on PCT/EP2011/072825 dated Mar. 30, 2012.
Search Report issued on GB1021853.5 dated Mar. 30, 2011.
International Search Report issued on PCT/EP2011/072823, dated Jul. 4, 2012.
International Search Report issued on PCT/EP2011/072822, dated May 23, 2012.
International Search Report issued on PCT/EP2011/072818, dated Jun. 22, 2012.
International Search Report issued on PCT/EP2011/072821, dated Mar. 2, 2012.
Silva, F., et al., Microwave engineering of plasma-assisted CVD reactors for diamond deposition, Journal of Physics; Condensed Matter, vol. 21, No. 364202, 2009.
Balmer et al., Chemical vapour deposition synthetic diamond: materials, technology and applications, JJournal of Physics: Condensed Matter, 2009, 364221, 21(36).
Whitfield et al., Nucleation and growth of diamond films on single crystal and polycrystalline tungsten substrates, Diamond and Related Materials, 2000, 262-268, 9.
Patent Cooperation Treaty, International Search Report issued on PCT/EP2011/072818, mailed Jun. 22, 2012, 7 pages.
Silva et al., Microwave engineering of plasma-assisted CVD reactors for diamond deposition, Journal of Physics: Condensed Matter, 2009, 364202, 21, 16 pps.
Funer, et al., Simulation and development of optimized microwave plasma reactors for diamond deposition, Surface and Coatings Technology, 1999, 853-862, vol. 116-119.
Hassouni et al., Self-consistent microwave field and plasma discharge simulations for a moderate pressure hydrogen discharge reactor, Journal of Applied Physics, 1999, 134-151, 86(1).

*Primary Examiner* — David Turocy
(74) *Attorney, Agent, or Firm* — Bryan Cave LLP

(57) ABSTRACT

A microwave plasma reactor for manufacturing synthetic diamond material via chemical vapor deposition, the microwave plasma reactor comprising: a microwave generator configured to generate microwaves at a frequency f; a plasma chamber comprising a base, a top plate, and a side wall extending from said base to said top plate defining a resonance cavity for supporting a microwave resonance mode between the base and the top plate; a microwave coupling configuration for feeding microwaves from the microwave generator into the plasma chamber; a gas flow system for feeding process gases into the plasma chamber and removing them therefrom; a substrate holder disposed in the plasma chamber and comprising a supporting surface for supporting a substrate; and a substrate disposed on the supporting surface, the substrate having a growth surface on which the synthetic diamond material is to be deposited in use, wherein the substrate dimensions and location within the resonance cavity are selected to generate a localized axisymmetric $E_z$ electric field profile across the growth surface in use, the localized axisymmetric $E_z$ electric field profile comprising a substantially flat central portion bound by a ring of higher electric field, the substantially flat central portion extending over at least 60% of an area of the growth surface of the substrate and having an $E_z$ electric field variation of no more than ±10% of a central $E_z$ electric field strength, the ring of higher electric field being disposed around the central portion and having a peak $E_z$ electric field strength in a range 10% to 50% higher than the central $E_z$ electric field strength.

19 Claims, 8 Drawing Sheets

(a)

(b)

(c)

(a)

(b)

(c)

(d)

MICROWAVE PLASMA REACTORS AND SUBSTRATES FOR SYNTHETIC DIAMOND MANUFACTURE

FIELD OF INVENTION

The present invention relates to a microwave plasma reactor for manufacturing synthetic diamond material using chemical vapour deposition techniques. Certain embodiments relate to substrates for use in a microwave plasma reactor for synthetic diamond manufacture.

BACKGROUND OF INVENTION

Chemical vapour deposition (CVD) processes for synthesis of diamond material are now well known in the art. Useful background information relating to the chemical vapour deposition of diamond materials may be found in a special issue of the Journal of Physics: Condensed Matter, Vol. 21, No. 36 (2009) which is dedicated to diamond related technology. For example, the review article by R. S Balmer et al. gives a comprehensive overview of CVD diamond materials, technology and applications (see "Chemical vapour deposition synthetic diamond: materials, technology and applications" J. Phys.: Condensed Matter, Vol. 21, No. 36 (2009) 364221).

Being in the region where diamond is metastable compared to graphite, synthesis of diamond under CVD conditions is driven by surface kinetics and not bulk thermodynamics. Diamond synthesis by CVD is normally performed using a small fraction of carbon (typically <5%), typically in the form of methane although other carbon containing gases may be utilized, in an excess of molecular hydrogen. If molecular hydrogen is heated to temperatures in excess of 2000 K, there is a significant dissociation to atomic hydrogen. In the presence of a suitable substrate material, diamond can be deposited.

Atomic hydrogen is essential to the process because it selectively etches off non-diamond carbon from the substrate such that diamond growth can occur. Various methods are available for heating carbon containing gas species and molecular hydrogen in order to generate the reactive carbon containing radicals and atomic hydrogen required for CVD diamond growth including arc-jet, hot filament, DC arc, oxy-acetylene flame, and microwave plasma.

Methods that involve electrodes, such as DC arc plasmas, can have disadvantages due to electrode erosion and incorporation of material into the diamond. Combustion methods avoid the electrode erosion problem but are reliant on relatively expensive feed gases that must be purified to levels consistent with high quality diamond growth. Also the temperature of the flame, even when combusting oxy-acetylene mixes, is insufficient to achieve a substantial fraction of atomic hydrogen in the gas stream and the methods rely on concentrating the flux of gas in a localized area to achieve reasonable growth rates. Perhaps the principal reason why combustion is not widely used for bulk diamond growth is the cost in terms of kWh of energy that can be extracted. Compared to electricity, high purity acetylene and oxygen are an expensive way to generate heat. Hot filament reactors while appearing superficially simple have the disadvantage of being restricted to use at lower gas pressures which are required to ensure relatively effective transport of their limited quantities of atomic hydrogen to a growth surface.

In light of the above, it has been found that microwave plasma is the most effective method for driving CVD diamond deposition in terms of the combination of power efficiency, growth rate, growth area, and purity of product which is obtainable.

A microwave plasma activated CVD diamond synthesis system typically comprises a plasma reactor vessel coupled both to a supply of source gases and to a microwave power source. The plasma reactor vessel is configured to form a resonance cavity supporting a standing microwave. Source gases including a carbon source and molecular hydrogen are fed into the plasma reactor vessel and can be activated by the standing microwave to form a plasma in high field regions. If a suitable substrate is provided in close proximity to the plasma, reactive carbon containing radicals can diffuse from the plasma to the substrate and be deposited thereon. Atomic hydrogen can also diffuse from the plasma to the substrate and selectively etch off non-diamond carbon from the substrate such that diamond growth can occur.

A range of possible microwave plasma reactors for diamond film growth via a chemical vapour deposition (CVD) process are known in the art. Such reactors have a variety of different designs. Common features include: a plasma chamber; a substrate holder disposed in the plasma chamber; a microwave generator for forming the plasma; a coupling configuration for feeding microwaves from the microwave generator into the plasma chamber; a gas flow system for feeding process gases into the plasma chamber and removing them therefrom; and a temperature control system for controlling the temperature of a substrate on the substrate holder.

The present inventors consider that when designing a microwave plasma reactor process for diamond film growth, to achieve a successful industrial process requires the assessment of a number of considerations including: chamber and microwave power coupling configuration; gas flow characteristics; and substrate design and temperature control. Certain embodiments of the present invention are primarily concerned with the aspects of substrate design and temperature control.

The most commonly used substrate for CVD diamond growth is silicon. One problem with using silicon as a substrate for CVD diamond growth in a microwave plasma growth process is power absorption by the silicon at high temperatures, leading to thermal runaway and fracture. Another problem is that silicon is readily incorporated into CVD diamond during growth, being particularly visible as the 737 nm Si—V defect. As such, the use of a silicon substrate can detrimentally affect the purity of the CVD diamond product. Yet another problem is that after growth of a CVD diamond wafer on a silicon substrate, recovery of the CVD diamond wafer may require, for example, one of mechanical or acid removal. These additional processing steps increase the time and expense of an industrially implemented process.

In light of the above, it is evident that it would be desirable to find an alternative substrate material which solves these problems.

One possibility for a substrate material is a carbide forming refractory metal such as tungsten, molybdenum, niobium, or alloys thereof. Such substrates have already been proposed in the art. For example, U.S. Pat. No. 5,261,959 suggests a refractory metal substrate material such as molybdenum in the form of a planar circular disk. Alternatively, Whitfield et al. suggest the use of a tungsten substrate (see "Nucleation and growth of diamond films on single crystal and polycrystalline tungsten substrates", Diamond and Related Materials, Volume 9, Issues 3-6, April-May 2000, Pages 262-268). Specifically, Whitfield et al. disclose the use of a polycrystalline tungsten disc 6.3 mm thick and 50 mm in diameter and a single crystal tungsten disc 6.3 mm thick and 8 mm in diameter in a 2.45 GHz microwave plasma reactor. The substrates were subjected to preparation steps including polishing to a mirror finish with a 1-3 micrometer diamond abrasive and cleaning via ultrasonic washing and an in situ plasma etch. Substrate temperatures were monitored using optical pyrometry and an embedded thermocouple during CVD diamond growth. Spontaneous delamination of the CVD diamond wafer from the tungsten substrate on cooling after growth is also disclosed to yield a free-standing diamond wafer due to the differences in thermal expansion coefficient between the CVD diamond wafer and the tungsten substrate. Whitfield et al. note that generally in their experiments the substrates were not reused but in the few cases where re-use did occur, substrates were lapped and polished for at least 24 hours to remove the thin carbide layer formed during the previous growth run.

In light of the above, it is evident that carbide forming refractory metals may provide an attractive alternative to silicon substrates. Despite this, the present inventors have experienced a number of problems when using such substrates. These include: non-uniform CVD diamond growth over the substrate; delamination of the CVD diamond wafer from the substrate during CVD diamond growth; and crack initiation and propagation during cooling after growth of the CVD diamond wafer. These problems tend to be exacerbated when larger substrates are used for growing large area polycrystalline diamond discs (e.g. 80 mm diameter or more) or when growing a plurality of single crystal diamonds in a single growth run on a plurality of single crystal diamond substrates adhered to a refractory metal substrate over a relatively large area (e.g. 80 mm diameter or more). This is particularly problematic as there is an on going need to increase the area over which high quality, uniform CVD diamond can be grown. Furthermore, these problems tend to be exacerbated when the substrates are reused in subsequent growth runs. This is particularly problematic as the substrates are expensive and reuse is desirable in an economically competitive industrial process.

It is an aim of certain embodiments of the present invention to at least partially address one or more of these problems. In particular, it is an aim of certain embodiments of the present invention to provide more uniform and/or more consistent CVD diamond products.

SUMMARY OF INVENTION

According to a first aspect of the present invention there is provided a microwave plasma reactor for manufacturing synthetic diamond material via chemical vapour deposition, the microwave plasma reactor comprising:
a microwave generator configured to generate microwaves at a frequency f;
a plasma chamber comprising a base, a top plate, and a side wall extending from said base to said top plate defining a resonance cavity for supporting a microwave resonance mode between the base and the top plate;
a microwave coupling configuration for feeding microwaves from the microwave generator into the plasma chamber;
a gas flow system for feeding process gases into the plasma chamber and removing them therefrom;
a substrate holder disposed in the plasma chamber and comprising a supporting surface for supporting a substrate; and
a substrate disposed on the supporting surface, the substrate having a growth surface on which the synthetic diamond material is to be deposited in use,
wherein the substrate dimensions and location within the resonance cavity are selected to generate a localized axisymmetric $E_z$ electric field profile across the growth surface in use, the localized axisymmetric $E_z$ electric field profile comprising a substantially flat central portion bound by a ring of higher electric field, the substantially flat central portion extending over at least 60% of an area of the growth surface of the substrate and having an $E_z$ electric field variation of no more than $\pm 10\%$ of a central $E_z$ electric field strength, the ring of higher electric field being disposed around the central portion and having a peak $E_z$ electric field strength in a range 10% to 50% higher than the central $E_z$ electric field strength.

According to an alternative definition of the first aspect of the present invention there is provided a microwave plasma reactor for manufacturing synthetic diamond material via chemical vapour deposition, the microwave plasma reactor comprising:
a microwave generator configured to generate microwaves at a frequency f;
a plasma chamber comprising a base, a top plate, and a side wall extending from said base to said top plate defining a resonance cavity for supporting a microwave resonance mode between the base and the top plate;
a microwave coupling configuration for feeding microwaves from the microwave generator into the plasma chamber;
a gas flow system for feeding process gases into the plasma chamber and removing them therefrom;
a substrate holder disposed in the plasma chamber and comprising a supporting surface for supporting a substrate; and
a substrate disposed on the supporting surface, the substrate having a growth surface on which the synthetic diamond material is to be deposited in use,
wherein a ratio of substrate diameter/height of the growth surface of the substrate is in a range 10 to 14, 11 to 13.5, or 11.0 to 12.5, wherein the height of the growth surface of the substrate is relative to a mean height of a surface surrounding the substrate.

According to a second aspect of the present invention there is provided a substrate for use in a microwave plasma reactor according to the first aspect of the invention, the substrate comprising:
a cylindrical disc of a carbide forming refractory metal having a flat growth surface on which CVD diamond is to be grown and a flat supporting surface opposed to said growth surface,
wherein the cylindrical disc has a diameter of 80 mm or more,
wherein the growth surface has a flatness variation no more than 100 µm, and
wherein the supporting surface has a flatness variation no more than 100 µm.

According to a third aspect of the present invention there is provided a method of manufacturing synthetic diamond material using a chemical vapour deposition process, the method comprising:
providing a reactor configured for manufacturing synthetic diamond material;
locating a substrate on a substrate holder within the reactor, the substrate comprising a growth surface on which synthetic diamond material is to be grown;
feeding process gases into the reactor; and
growing synthetic diamond material on the growth surface of the substrate, wherein the method further comprises:
taking at least two temperature measurements, including one or more measurements in a central region of the growth surface of the substrate and one or more measurements in a peripheral region of the growth surface of the substrate during growth of the synthetic diamond material; and
controlling a temperature difference between the central region and the peripheral region of the growth surface of the substrate during growth of the synthetic diamond material based on the at least two temperature measurements,
wherein the temperature of the growth surface of the substrate during growth of the synthetic diamond material is controlled to fulfil the condition 5° C.<$T_c - T_e$<120° C., where $T_c$ is a temperature in the central region of the growth surface of the substrate and $T_e$ is a temperature in the peripheral region of the growth surface of the substrate.

According to a fourth aspect of the present invention there is provided a method of manufacturing synthetic diamond material using a chemical vapour deposition process, the method comprising:
providing a reactor configured for manufacturing synthetic diamond material;
locating a substrate over a substrate holder within the reactor, the substrate comprising a growth surface on which synthetic diamond material is to be grown;
feeding process gases into the reactor; and
growing synthetic diamond material on the growth surface of the substrate,
wherein the synthetic diamond material is grown to form a polycrystalline diamond wafer having a diameter of at least 120 mm,
and wherein the polycrystalline diamond wafer is spontaneously delaminated from the substrate on cooling after the chemical vapour deposition process is completed to yield a free-standing polycrystalline diamond wafer which is substantially crack free over at least a central region thereof, wherein the central region is at least 70% of a total area of the free-standing polycrystalline diamond wafer, and wherein the central region has no cracks which intersect both external major faces of the free-standing polycrystalline diamond wafer and extend greater than 2 mm in length.

BRIEF DESCRIPTION OF THE DRAWINGS

For a better understanding of the present invention and to show how the same may be carried into effect, embodiments of the present invention will now be described by way of example only with reference to the accompanying drawings, in which.

DETAILED DESCRIPTION OF CERTAIN EMBODIMENTS

Figure 1:
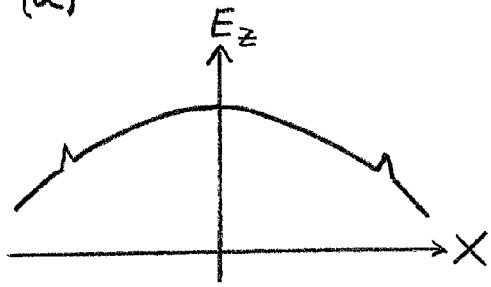
FIGS. 1(a) to 1(c) show electric field profile plots for varying heights of substrate within a microwave plasma reactor.
Figure 1:
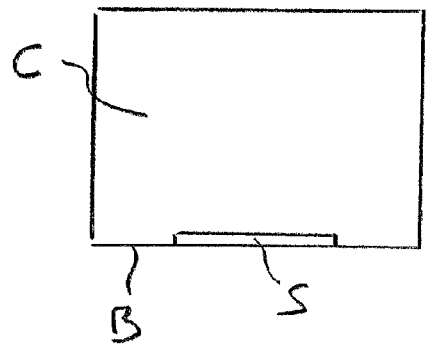
Figure 1:
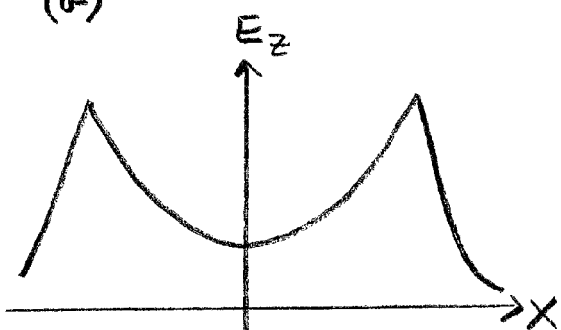
Figure 1:
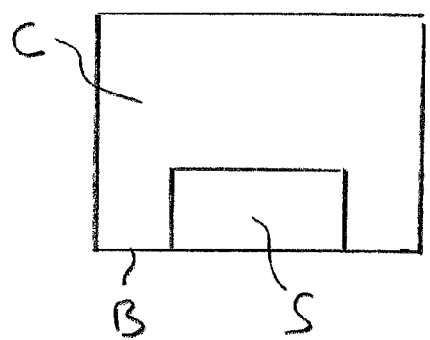
Figure 1:
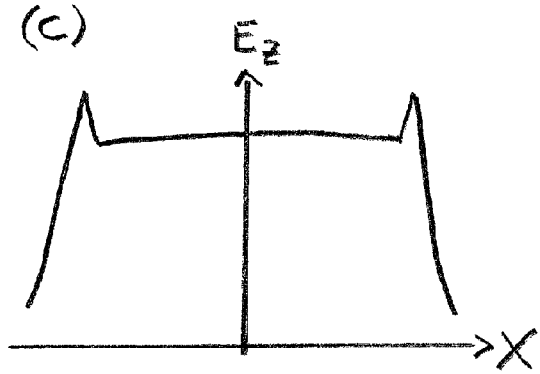
Figure 1:
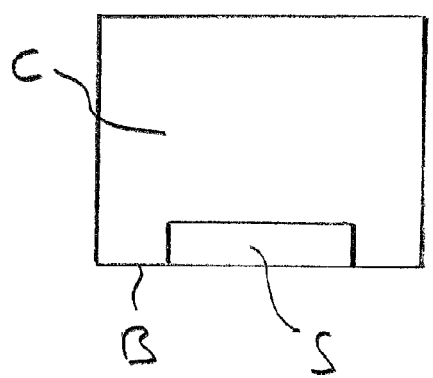

It is considered desirable to provide a microwave plasma reactor which is configured to form a uniform, large area plasma above a substrate in order to provide uniform CVD diamond growth over a large area of the substrate. Intuitively, one would expect that a microwave plasma reactor should be configured to support a uniform electric field above the substrate in order to form such a uniform plasma. The first aspect of the present invention is based on the seemingly counter-intuitive finding that a non-uniform electric field of a particular form can produce a more uniform plasma over a larger area than a corresponding uniform underlying electric field and that this can lead to more uniform CVD diamond growth over larger areas. In particular, the present inventors have found that it is preferable to form an electric field having an axisymmetric $E_z$ profile comprising a substantially flat central portion bound by a ring of higher electric field, the substantially flat central portion extending over at least 60% of an area of the growth surface of the substrate and having an $E_z$ electric field variation of no more than ±10%, 8%, 6%, 5%, 4%, 3%, 2%, or 1% of a central $E_z$ electric field strength. The ring of higher electric field is disposed around the central portion and has a peak $E_z$ electric field strength in a range 10% to 50%, 10% to 40%, 15% to 30%, or 15% to 25% higher than the central $E_z$ electric field strength. It has been found that the ring of higher electric field can aid in pulling the plasma outwards to form a flat, large area plasma above the substrate. Furthermore, as the plasma edges have higher radiative and convective losses, the ring of higher electric field is considered advantageous to compensate for such losses. The uniform plasma may then provide uniform heat flow towards the underlying substrate and uniform transport of active species to the growth surface of the substrate to yield uniform CVD diamond growth over large areas.

It has been found that an electric field profile as previously described can be formed by selecting suitable substrate dimensions and positioning the substrate in the correct location within the resonance cavity of the plasma reactor. In this regard, it is possible to model the electric field for particular chamber configurations to determine the electric field profile above the substrate growth surface. The electric field profile may be modelled by performing electromagnetic field calculations for a resonance cavity of specified dimensions at resonance (not necessarily at driving frequency). The calculations can be made using an Eigenvalue differential equation solver. The localized axisymmetric $E_z$ electric field profile can vary according to the height at which it is calculated relative to the growth surface of the substrate. In accordance with embodiments of the present invention the localized axisymmetric $E_z$ electric field profile is calculated at a height above the growth surface of the substrate of: 4 mm, 6 mm, or 8 mm for a microwave frequency f in a range 400 MHz to 500 MHz; 2 mm, 3 mm, or 4 mm for a microwave frequency f in a range 800 MHz to 1000 MHz; or 0.7 mm, 1.0 mm, or 1.5 mm for a microwave frequency f in a range 2300 MHz to 2600 MHz.

It has been found that the electric field profile is significantly perturbed when a substrate is introduced into the resonance cavity as can be shown by modelling or empirical measurement. In this regard, FIGS. 1(a) to 1(c) illustrate electric field profile plots showing how the electric field varies with differing height of a substrate within a resonance cavity of a plasma reactor. The plots show the magnitude of the electric field $E_z$ on the Y-axis against the lateral position X across the diameter of the resonance cavity above the substrate.

FIG. 1(a) illustrates the electric field profile when the growth surface of the substrate S is located just above a base B of the resonance cavity C. The electric field profile is dominated by that of the empty chamber which is a $J_0$ Bessel function for a $TM_{01n}$ chamber. There is only a slight contribution to the electric field magnitude from the upper edge of the substrate forming a coaxial mode set up between the substrate and the chamber wall. In this arrangement, the electric field is high above a central region of the substrate and drops off significantly towards the edge of the substrate. As such, this electric field profile results in poor CVD diamond growth in a peripheral region of the substrate growth surface.

FIG. 1(b) illustrates the electric field profile when the growth surface of the substrate S is located high above the base B of the resonance cavity C. The electric field profile is now dominated by the coaxial mode set up between the substrate and the chamber wall which decays evanescently into a central region of the chamber. In this arrangement, the electric field is high above a peripheral region of the substrate and drops off towards the central region of the substrate. As such, this electric field profile results in poor CVD diamond growth in a central region of the substrate growth surface.

FIG. 1(c) illustrates the electric field profile when the growth surface of the substrate S is located at the correct height above a surrounding surface within the resonance cavity C. The electric field profile of the empty chamber is balanced with the coaxial mode set up between the substrate and the chamber wall to form a substantially uniform electric field region over the majority of the substrate with a ring of higher electric field localized around the substrate edge. The central region of the electric field is substantially uniform but has a slightly lower electric field region just inside the ring of higher electric field localized around the substrate edge. One would think that this lower electric field region would lead to poor CVD diamond growth at this region of the growth surface. However, in practice it has been found that the higher electric field ring immediately outside the region of lower electric field aids in pulling the plasma outwards, compensating for the slight non-uniformity in the central region and resulting in a large, flat, uniform plasma over the majority of the substrate enabling uniform CVD diamond growth over large areas.

It should be noted that while the electric field profile is a property present when the microwave plasma reactor in use, it is also uniquely defined when not in use by modelling the microwave plasma reactor's electric field profile either at its resonant frequencies, or when modelled as being present if driven by a given frequency. Either of these models may be applied to a microwave plasma reactor to determine its electric field profile without undue burden.

While the first aspect of the present invention has been described above in relation to the electric field profile, which requires modelling (e.g. modelled at resonance) or empirical measurement to determine, a more simplistic definition may be given in terms of simple dimensional data for the substrate and its location within the resonance cavity of a plasma reactor. In practice, the present inventors have found that a large, flat, uniform plasma over the majority of the substrate enabling uniform CVD diamond growth over large areas can be achieved when a ratio of substrate diameter/height of the growth surface of the substrate is in a range 10 to 14, 11 to 13.5, or 11.0 to 12.5, wherein the height of the growth surface of the substrate is relative to a mean height of a surface surrounding the substrate. Accordingly, this alternative definition of the first aspect of the invention may be utilized without modelling or empirical measurement. However, if an arrangement falls outside these ranges, it is envisaged that utilizing some alternative chamber geometry it may still be possible to form the electric field profile as previously described. In this case, modelling or empirical measurements may be required in order to confirm whether or not the arrangement conforms with the first aspect of this invention. Conversely, if an arrangement falls outside the definition of the first aspect of the invention based on the electric field profile it may still fall within the alternative definition based on the ratio of substrate diameter/height of the growth surface of the substrate. This may be the case if the dimensions and location of the substrate within the plasma chamber are selected to form an electric field profile as described but some further element or elements are provided to alter the electric field profile above the substrate. For example, as described later a metallic ring may be located around the substrate to reduce the magnitude of the high electric field ring located above the edge of the substrate. Alternatively, or additionally, the substrate holder may be profiled to perturb the electric field in order to reduce the magnitude of the high electric field ring located above the edge of the substrate. Other electric field modifying elements are also envisaged. For example, further metallic bodies which perturb the electric field profile may be located on the substrate holder such as metallic inserts located under the substrate. As such, these arrangements may be configured to have the correct substrate diameter/growth surface height ratio while having an electric field profile without a significant high electric field ring located above the edge of the substrate.

Figure 2:
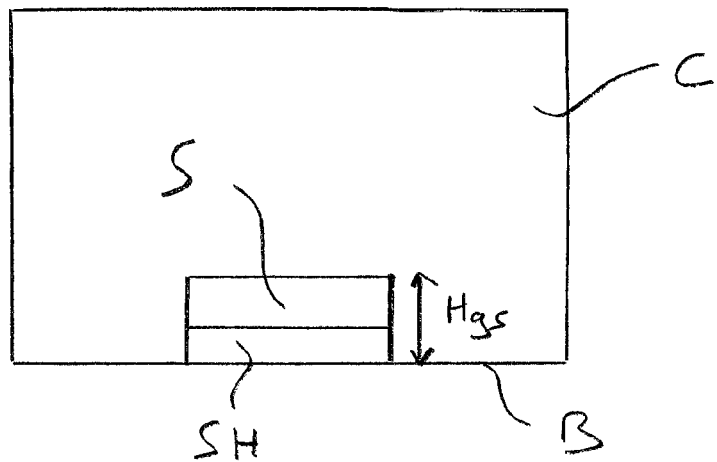
FIGS. 2(a) to 2(c) show how the height of the growth surface of the substrate is calculated relative to relative to a mean height of a surface surrounding the substrate.
Figure 2:
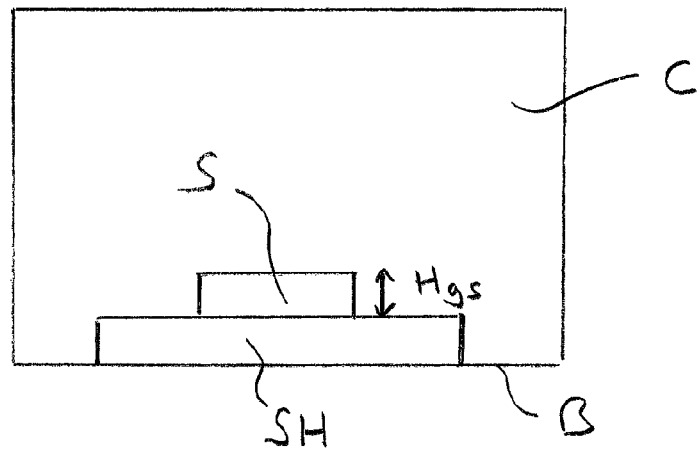
Figure 2:
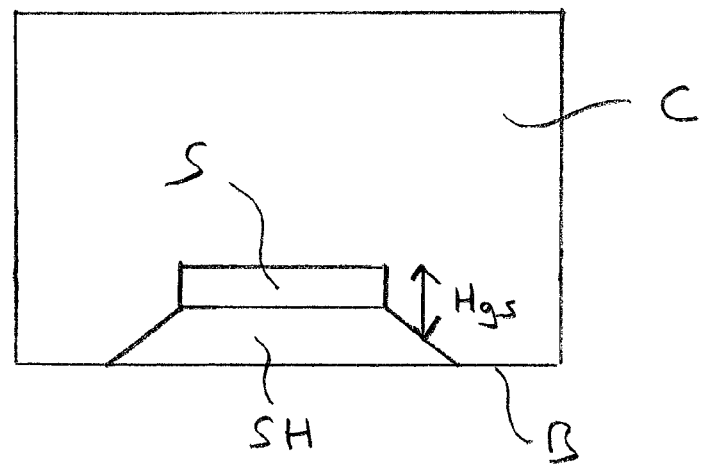

For an arrangement in which the substrate holder is the same diameter as the substrate, the substrate holder will be located wholly under the substrate and the surface surrounding the substrate may be formed by the base of the plasma chamber. As such, in this case the mean height of the surface surrounding the substrate will equate to the height of the base B of the plasma chamber C and the height of the growth surface of the substrate, $H_{gs}$, will be measured from the base of the plasma chamber surrounding the substrate S and substrate holder SH as illustrated in FIG. 2(a). Alternatively, for an arrangement in which the substrate holder is much larger than the substrate thus forming a large flat surface which surrounds the substrate, the mean height of the surface surrounding the substrate will equate to a top surface of the substrate holder. As such, in this case the height of the growth surface of the substrate, $H_{gs}$, will be measured from the top surface of the substrate holder SH surrounding the substrate S as illustrated in FIG. 2(b). For an arrangement in which the substrate holder extends outwards from the substrate with a sloped, curved, or stepped top surface surrounding the substrate then the mean height of the local surrounding surface, $H_{lss}$, can be defined by a mean of a height, $H_{local}$, of a cross section between the edge of the substrate, at Rs, and a distance approximately two times the thickness of the substrate, 2×Ts, away from the substrate edge, taken in a radial direction, X:

$$H_{lss} = \frac{1}{2Rs} \int_{Rs}^{Rs+2Ts} H_{local} \, dX$$

Such an arrangement is illustrated in FIG. 2(c) for a sloped substrate holder. For example, for a substrate holder having a top surface sloping away from the substrate at an angle of 45° to a distance 2×Ts from the substrate in a radial direction, the mean height of the surface surrounding the substrate will equate to half the height of the substrate holder SH. As such, in this case the height of the growth surface of the substrate, $H_{gs}$, will be measured from half the height of the substrate holder SH.

In relation to the above, it has been found that providing a step of a particular height between the substrate growth surface and the local surrounding surface perturbs the electric field profile of the plasma chamber in such a way that the electric field profile of the empty chamber is balanced with a coaxial mode set up between the substrate and the chamber wall to form a substantially uniform electric field region over the majority of the substrate with a ring of higher electric field localized around the substrate edge as previously described.

Embodiments of the present invention are particularly suited for application in $TM_{01n}$ resonance chambers. The particular geometry required to implement the first aspect of the invention will also depend on the operational frequency of the plasma reactor. Examples of suitable geometries are set out below.

The substrate diameter may be selected to be in the range: 165 mm to 415 mm, 185 mm to 375 mm, 205 mm to 375 mm, 205 mm to 330 mm, or 240 mm to 330 mm for a microwave frequency f in the range 400 to 500 MHz; 80 mm to 200 mm, 90 mm to 180 mm, 100 mm to 180 mm, 100 mm to 160, or 115 mm to 160 mm for a microwave frequency f in the range 800 to 1000 MHz; or 30 mm to 75 mm, 33 mm to 65 mm, 37 mm to 65 mm, 37 mm to 58 mm, or 42 mm to 58 mm for a microwave frequency f in the range 2300 to 2600 MHz.

The height of the growth surface of the substrate above the mean height of the surrounding surface may be selected to be in the range: 10 mm to 30 mm or 14 mm to 27 mm for a microwave frequency f in the range 400 to 500 MHz; 5 mm to 15 mm or 7 mm to 13 mm for a microwave frequency f in the range 800 to 1000 MHz; or 2.0 mm to 5.5 mm or 2.5 mm to 5.0 mm for a microwave frequency f in the range 2300 to 2600 MHz.

Particularly useful height and diameter combinations for a number of operational frequency bands are given below.

If the microwave frequency f is in the range 400 MHz to 500 MHz, the substrate diameter and the height of the growth surface of the substrate above the mean height of the surrounding surface within the resonance cavity may be optionally selected such that:
 if the substrate diameter is in the range 180 mm to 230 mm, the height of the growth surface is in the range 14 mm to 20 mm;
 if the substrate diameter is in the range 230 mm to 270 mm, the height of the growth surface is in the range 20 mm to 24 mm; or
 if the substrate diameter is in the range 270 mm to 310 mm, the height of the growth surface is in the range 22 mm to 27 mm.

If the microwave frequency f is in the range 800 MHz to 1000 MHz, the substrate diameter and the height of the growth surface of the substrate above the mean height of the surrounding surface within the resonance cavity may be optionally selected such that:
 if the substrate diameter is in the range 90 mm to 110 mm, the height of the growth surface is in the range 7 mm to 10 mm;
 if the substrate diameter is in the range 110 mm to 130 mm, the height of the growth surface is in the range 9.5 mm to 11.5 mm; or
 if the substrate diameter is in the range 130 mm to 150 mm, the height of the growth surface is in the range 11 mm to 13 mm.

If the microwave frequency f in the range 2300 MHz to 2600 MHz, the substrate diameter and the height of the growth surface of the substrate above the mean height of the surrounding surface within the resonance cavity may be selected such that:
 if the substrate diameter is in the range 30 mm to 40 mm, the height of the growth surface is in the range 2.5 mm to 3.7 mm;
 if the substrate diameter is in the range 40 mm to 48 mm, the height of the growth surface is in the range 3.5 mm to 4.2 mm; or
 if the substrate diameter is in the range 48 mm to 55 mm, the height of the growth surface is in the range 4.0 mm to 4.8 mm.

In relation to the above, it should be noted that it is possible to invert the reactor in use. For example, in standard usage, the substrate will be supported by the base of the chamber which will form the lower wall of the chamber relative to the earth. However, it is possible to invert the reactor such that the base of the chamber supporting the substrate will form the upper wall of the chamber relative to the earth. In this arrangement, the height of the growth surface above the mean height of the surrounding surface is measured in a downwards direction. In the inverted orientation gas flow towards the substrate may be parallel to principle thermally driven convection currents (which are in an upwards direction due to the large amount of heat generated lower down in the plasma chamber). This inverted arrangement may have some benefits for certain applications.

The magnitude of the coaxial mode set up between the substrate and the chamber wall may also be affected by the ratio of a resonance cavity diameter/substrate diameter. Accordingly, in certain arrangements it may be preferred to provide a configuration in which a ratio of resonance cavity diameter/substrate diameter is in the range 1.5 to 5, 2.0 to 4.5, or 2.5 to 4.0, wherein the resonance cavity diameter is measured at a height less than 50%, 40%, 30%, or 20% of a height of the resonance cavity. In one particularly preferred arrangement the aforementioned ratios hold when the resonance cavity diameter is measured at a height of the growth surface of the substrate.

Embodiments of the first aspect of the invention thus aim to provide a plasma reactor configuration which is capable of achieving uniform CVD diamond growth over large areas. Furthermore, the uniform plasma achieved by such configurations also provides relatively uniform heat flow towards the substrate which has been found to aid in alleviating the problem of cracking of the CVD diamond when the CVD diamond cools after growth. In this regard, stress balance in a CVD diamond wafer is largely determined by the variation in growth temperatures over the diamond wafer. Hotter regions during growth contract more during cool down, and are therefore in tension; cooler regions contract less, and therefore remain in compression. Variations in stress within the CVD diamond wafer during cooling can result in cracking. As such, large variations in substrate temperature are not desirable.

That said, one potential problem using the previously described arrangement is that the high electric field ring disposed around the edge of the substrate can lead to higher substrate temperatures at the edge of the substrate and this can potentially lead to cracking of the substrate when the CVD diamond material cools after growth. Indeed, rather than having a completely uniform temperature across the substrate growth surface as might be intuitively desired, the present inventors consider that it is actually desirable to ensure that the edge temperature of the substrate growth surface is lower that the temperature in a central region of the substrate growth surface. The reason for such an arrangement is that crack propagation can be minimised by ensuring that compressive regions within the CVD diamond material are near where cracks can originate, i.e. near the edge of the CVD diamond wafer. Accordingly, keeping the edge of the substrate growth surface slightly cooler than a central region during growth is considered to be advantageous in forming a compressive region near the edge of the resulting CVD diamond wafer. If a crack is initiated at an edge of a CVD diamond wafer during cooling, the compressive region near the edge of the CVD diamond wafer prevents the crack from propagating towards the centre of the CVD diamond wafer. As such, any cracks which are initiated tend to remain short and located at an outer edge of the CVD diamond wafer which can subsequently be processed to remove any minor edge damage.

Accordingly, it has been found to be advantageous in certain circumstance to modify the microwave plasma reactor so that it comprises one or more temperature measurement devices configured to take at least two temperature measurements, including one or more measurements (optionally two or more) in a central region of the growth surface of the substrate and one or more measurements (optionally two or more) in a peripheral region of the growth surface. Furthermore, a substrate temperature control system may be provided and configured to control a temperature difference between the central region and the peripheral region of the growth surface of the substrate during CVD diamond growth thereon based on the temperature measurements. The central temperature measurements may be taken within a central region having an outer diameter no greater than 50%, 40%, 30%, 20%, or 10% of the diameter of the growth surface. The peripheral temperature measurements may be taken in a peripheral region of the growth surface of the substrate having an inner diameter greater than 50%, 60%, 70%, 80%, 90% or 95% of the diameter of the growth surface.

The substrate temperature control system may be configured to control the temperature of the growth surface of the substrate during CVD diamond growth thereon to fulfil the condition: $5°\ C.<T_c-T_e<120°\ C.$; $10°\ C.<T_c-T_e<100°\ C.$; $10°\ C.<T_c-T_e<80°\ C.$; $20°\ C.<T_c-T_e<80°\ C.$; or $20°\ C.<T_c-T_e<60°\ C.$, where $T_c$ is a temperature in the central region of the growth surface and $T_e$ is a temperature in the peripheral region of the growth surface. If Tc–Te becomes too large, excessive tension may be created in the central region of the CVD diamond wafer during cooling, leading to cracking in the central region of the CVD diamond wafer. If Tc–Te becomes too small, compressive regions will not form near the edge of the CVD diamond wafer and any cracks which initiate at the edge of the wafer are more likely to propagate across the CVD diamond wafer resulting in very long cracks, including complete wafer fracture. The system is advantageously fully automated to take temperature measurements and adjust the temperature of the substrate accordingly. Alternatively, or additionally, the system may be configured so that manual adjustments to the substrate temperature can be made based on the temperature measurements.

There are potentially a number of different ways a substrate temperature control system may be configured to control the temperature difference between the central region and the peripheral region of the growth surface of the substrate during CVD diamond growth. One possibility is to use a gas gap disposed under the substrate. In such an arrangement, the substrate is disposed over the supporting surface of the substrate holder and spaced apart by spacer elements to form a gas gap having a height h between the supporting surface of the substrate holder and a lower surface of the substrate. The substrate temperature control system may then comprise a gas supply system for supplying gas to the gas gap. The spacer elements can be configured to define a central gas gap cavity under the substrate in which gas from the gas supply system can pool and alter the thermal conductivity of the gas gap thus allowing the relative temperature of the central and peripheral regions of the substrate to be controlled. The gas supply system for supplying gas to the gas gap cavity under the substrate may supply an amount of gas which is equal to or less than 5%, 4%, 3%, 2%, or 1% of a total gas flow into the plasma chamber. That is, the gas supplied under the substrate is only a small fraction of the total gas supplied into the plasma chamber, the majority being process gas supplied through the main gas inlet to the plasma chamber which is advantageously located at an opposite end of the plasma chamber to the substrate. It has been found that such a quantity of gas supplied to the gas gap cavity is sufficient to pool under the substrate in the gas gap and control the temperature of the substrate in a manner described herein without unduly disrupting the main flow of process gas towards and around the substrate to the gas outlets. That is, the gas supply system for supplying gas to the gas gap cavity to control the temperature of the substrate is configured such that it does not adversely affect the gas flow from the primary process gas inlet.

Figure 3:
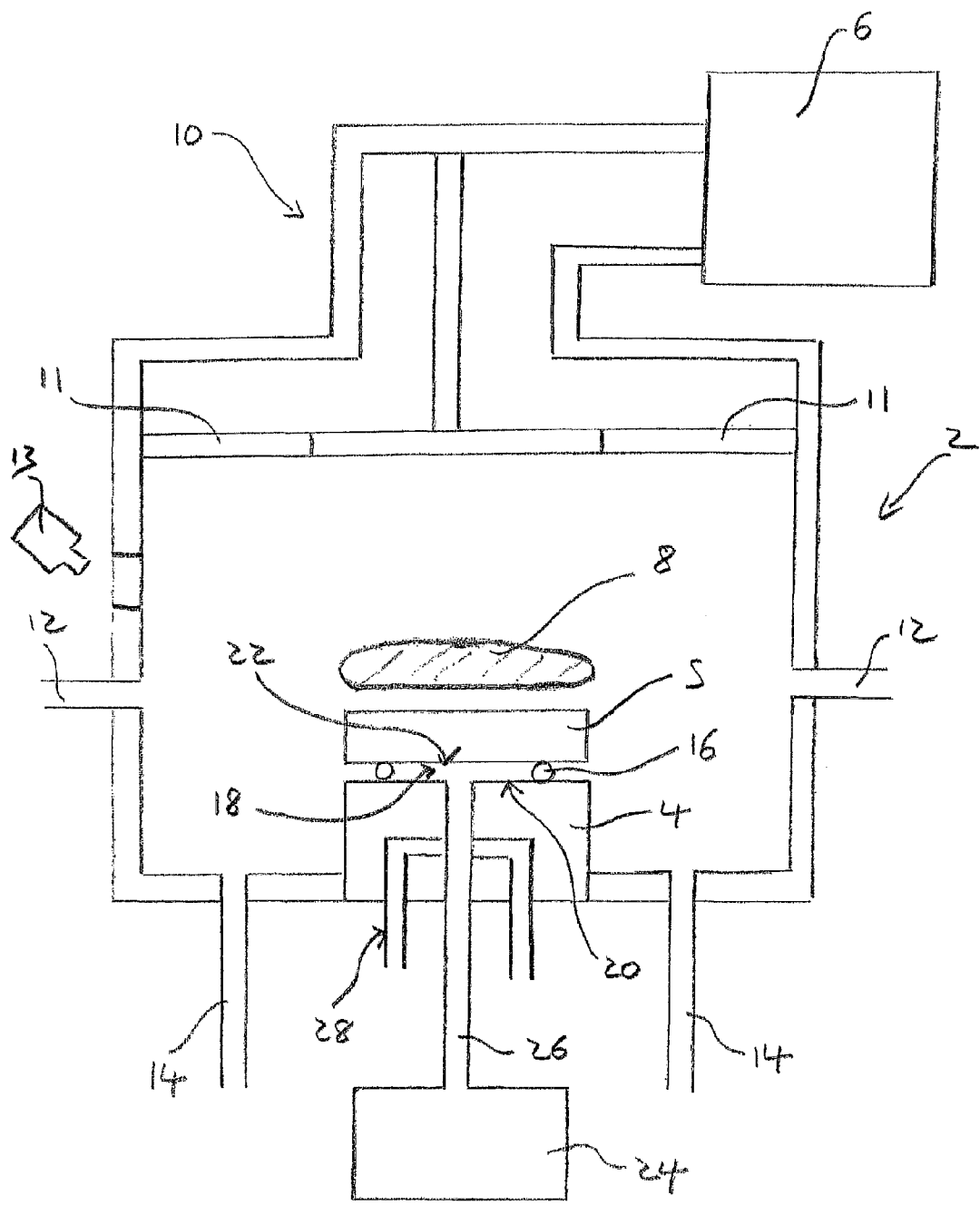
FIG. 3 shows a cross-sectional view of a microwave plasma reactor configured according to an embodiment of the present invention.

FIG. 3 shows an example of a microwave plasma reactor comprising such a substrate temperature control system. The microwave plasma reactor comprises the following basic components: a plasma chamber 2; a substrate holder 4 disposed in the plasma chamber for supporting a substrate 5; a microwave generator 6, for forming a plasma 8 within the plasma chamber 2; a microwave coupling configuration 10 for feeding microwaves from the microwave generator 6 into the plasma chamber 2 via dielectric windows 11; and a gas flow system comprising one or more gas inlets 12 and one or more gas outlets 14 for feeding process gases into the plasma chamber 2 and removing them therefrom.

The plasma chamber is configured to form a resonance cavity supporting a standing microwave in use. According to one configuration the plasma chamber is configured to support a $TM_{01n}$ standing microwave in use, e.g. a $TM_{011}$ mode. The operational frequency may be in a range 400 to 500 MHz, 800 to 1000 MHz, or 2300 to 2600 MHz. Source gases including a carbon source and molecular hydrogen are fed into the plasma reactor vessel and can be activated by the standing microwave to form a plasma in high electric field regions. If a suitable substrate is provided in close proximity to the plasma, reactive carbon containing radicals can diffuse from the plasma to the substrate and be deposited thereon. Atomic hydrogen can also diffuse from the plasma to the substrate and selectively etch off non-diamond carbon from the substrate such that diamond growth can occur.

The substrate 5 is spaced apart from the substrate holder 4 by spacer wires or spacer pads 16 to define a gas gap 18 between a supporting surface 20 of the substrate holder 4 and a supporting surface 22 of the substrate 5. The height h of the gas gap may be in the range 25 µm to 2000 µm, 50 µm to 1000 µm, or 100 µm to 750 µm depending on the specific synthesis conditions. For example, for certain high temperature diamond synthesis processes a gas gap height in the range 500 μm to 750 μm or 600 μm to 650 μm has been found to be preferred. For certain lower temperature diamond synthesis processes a gas gap height in the range 100 μm to 300 μm or 150 μm to 250 μm has been found to be preferred. Furthermore a gas supply system 24 is coupled to the gas gap 18 via a supply pipe 26 which extends from the gas supply system 24 through the substrate holder 4 and is configured to supply gas into the gas gap 18 through one or more outlets in the supporting surface of the substrate holder. A coolant liquid supply system 28 is also provided for cooling the substrate holder 4.

It should also be noted that while the microwave plasma reactor illustrated in FIG. 3 has a separate substrate holder disposed in the plasma chamber, the substrate holder may be formed by the base of the plasma chamber. The use of the term "substrate holder" is intended to cover such variations. Furthermore, the substrate holder may comprise a flat supporting surface which is the same diameter (as illustrated) or larger than the substrate. For example, the substrate holder may form a large flat surface, formed by the chamber base or a separate component disposed over the chamber base, and the substrate may be carefully positioned on a central region of the flat supporting surface. In one arrangement, the flat supporting surface may have further elements, for example projections or grooves, to align, and optionally hold, the substrate. Alternatively, no such additional elements may be provided such that the substrate holder merely provides a flat supporting surface over which the substrate is disposed.

The coolant liquid supply system provides a rough basic cooling to the substrate holder. However, this system has been found to be insufficiently precise for the fine temperature control of the substrate which is considered to be required by the present inventors in order to obtain high quality, uniform deposition of CVD diamond over large areas. Accordingly, the gas supply system is provided in order to allow more precise control of the substrate temperature. The gas supply system may be configured to inject at least two gases having different thermal conductivities into the gas gap below the substrate and vary a ratio of the at least two gases in order to control the temperature of the substrate on the substrate holder. For example, the gas supply system may utilize a mixture of a light gas such as hydrogen and a heavy gas such as argon which is less thermally conductive. Advantageously, the gases used to control the temperature of the substrate are ones which are also utilized in the main process chemistry so that additional gas sources are not required. If the edge temperature of the substrate is too high relative to the central region of the substrate, the proportion of heavy gas relative to light gas can be increased to reduce the thermal conductivity of the gas under a central region of the substrate, thus causing the central region of the substrate to heat up relative to the edge of the substrate. Conversely, if the edge temperature of the substrate is too low relative to the central region of the substrate, the proportion of light gas relative to heavy gas can be increased to increase the thermal conductivity of the gas under a central region of the substrate, thus causing the central region of the substrate to cool down relative to the edge of the substrate. The absolute temperature of the substrate as well as the relative temperature of different regions of the substrate can also be controlled by varying gas flow and gas composition within the gas gap under the substrate.

Figure 4:
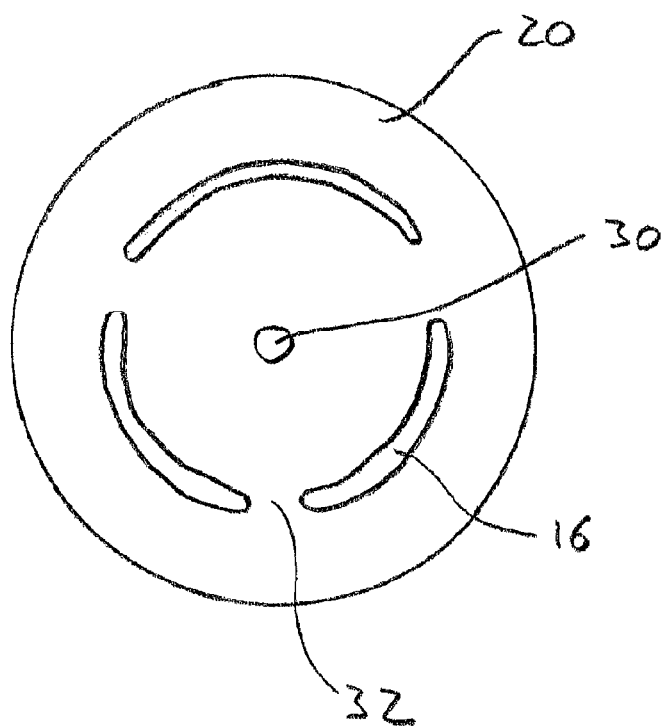
FIG. 4 shows a plan view of a portion of the microwave plasma reactor in more detail illustrating a substrate holder and spacer wires.

FIG. 4 shows a plan view of a portion of the microwave plasma reactor in more detail illustrating the substrate holder supporting surface 20 and spacer wires 16 disposed thereon. The supporting surface 20 of the substrate holder has at least one gas inlet 30 for supplying gas to the gas gap. The at least one gas inlet 30 is preferably positioned cento-symmetrically in the supporting surface 20. The spacer wires 16 may be configured to define a central gas gap cavity under the substrate so that the gas pools in the central gas gap cavity. In the illustrated embodiment, the spacer wires 16 are each arcuate in shape and configured into a ring with gaps 32 therebetween through which the gas can flow. The spacer elements may be electrically conductive and/or may be fixed in place with an electrically conductive adhesive such as Silver DAG™ which has been found to be useful in ensuring a good electrical contact between the spacer elements and the substrate holder. This aids in preventing the problem of arcing under the substrate which can detrimentally affect temperature control. It has also been noted that the position of gaps between the ring sections of the spacer wires can produce a variation in thickness of the diamond wafer. If desired, the number and position can be adjusted to compensate for other non-uniformities inherent in diamond wafers produced by a given reactor.

The microwave plasma reactor further comprises one or more temperature measurement devices configured to take at least two temperature measurements, including one or more measurements in a central region of the growth surface of the substrate and one or more measurements in a peripheral region of the growth surface of the substrate as previously described. The temperature measurements may be taken simultaneously or within a short time interval of each other and the substrate temperature control system may be used to ensure that the temperature gradient does not move outside the previously described ranges. The temperature measurement device may comprise a pyrometer 13 as illustrated in FIG. 3. Two pyrometers may be provided, one to take the central temperature measurements and one to take the peripheral temperature measurements. Alternatively, a plurality of thermocouples can be embedded into the substrate. That said, embedding thermocouples has been found to be difficult and can be unreliable. As such, a plurality of pyrometry measurements is considered to be the better solution. In this regard, it will be noted that as polycrystalline diamond material forms over the substrate growth surface, pyrometric measurements may focus on the temperature of the growing CVD diamond material. However, as the material is in good thermal contact with the underlying substrate then the temperature of the polycrystalline diamond material will equate to the temperature of the underlying growth surface of the substrate. For single crystal diamond growth, the temperature measurements are preferably taken between the growing single crystals. Since diamond can be transparent at certain pyrometry wavelengths, the pyrometric measurements may focus through the diamond onto the underlying growth surface of the substrate if a suitable wavelength is selected for the pyrometric measurements.

The substrate temperature control system may further comprise a temperature modifying ring disposed around the substrate to cool the peripheral region of the growth surface of the substrate. The temperature modifying ring may be formed by providing a profile in the supporting surface of the substrate holder around the substrate or by providing a separate component disposed over the substrate holder.

Figure 5:
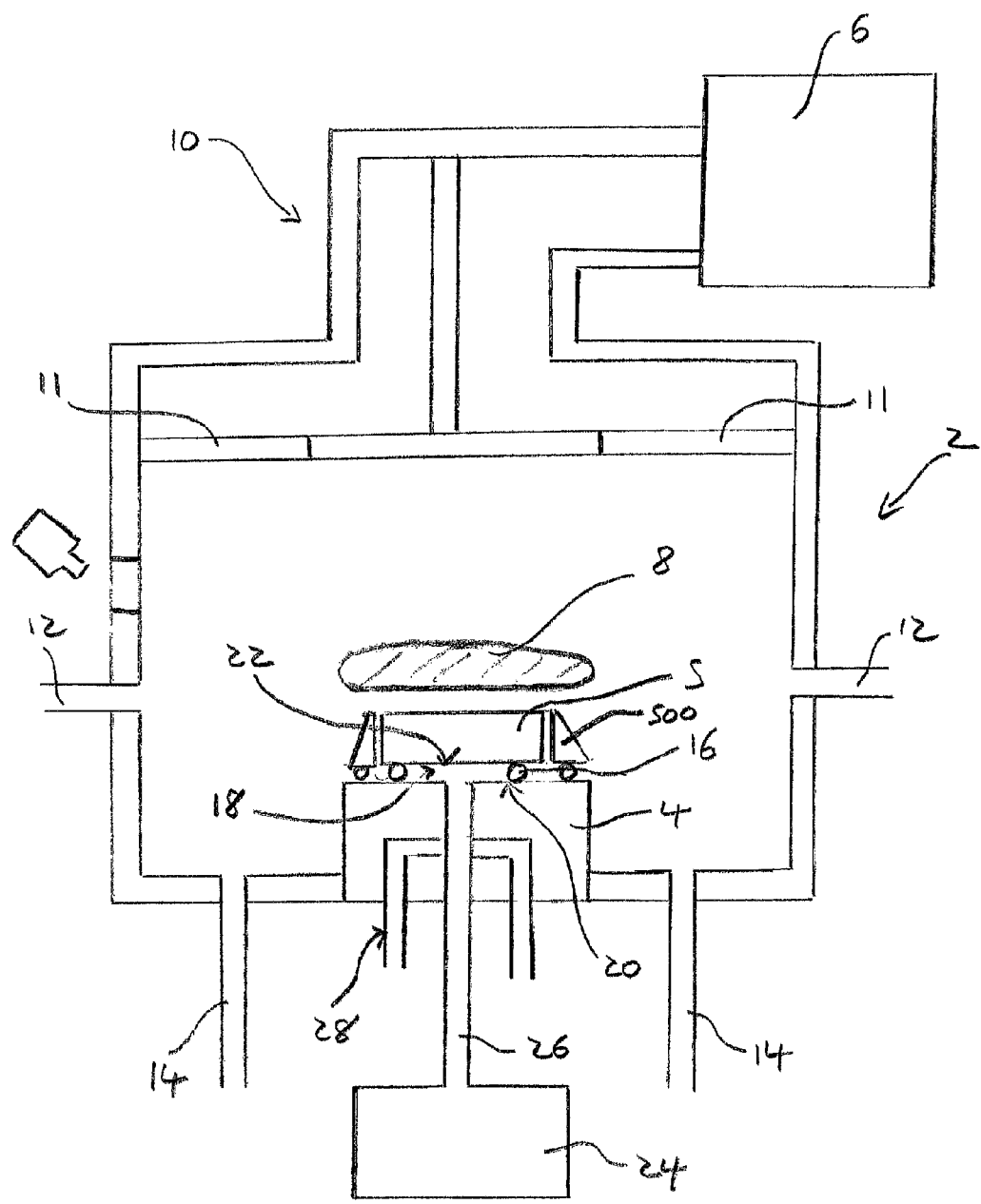
FIG. 5 shows a cross-sectional view of another microwave plasma reactor configured to include a temperature modifying ring disposed over the substrate holder and around the substrate.

FIG. 5 shows a cross-sectional view of another microwave plasma reactor configured to include such a temperature modifying ring 500 disposed over the substrate holder 4 and around the substrate 5. The temperature modifying ring 500 is disposed on spacers in a similar manner to the substrate or supported on the substrate holder via supporting legs which can be machined into a lower surface of the temperature modifying ring to provide contact points with the substrate holder. In other respects, the arrangement illustrated in FIG. 5 is the same as that shown in FIG. 3.

Figure 6:
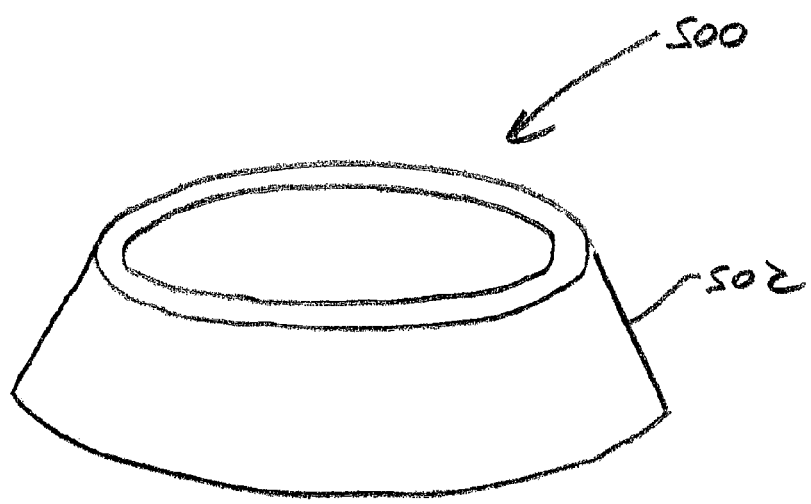
FIG. 6 shows the temperature modifying ring in more detail.

FIG. 6 shows the temperature modifying ring in more detail. The ring should be robust to the harsh thermal environment present in the plasma chamber. Advantageously the ring should have a melting point greater than 500° C. and a thermally conductivity greater than 10 $Wm^{-1}K^{-1}$. The ring is preferably metallic. Furthermore, the ring may have an electrical conductivity greater than $1\times10^5$ $Sm^{-1}$. Examples of suitable materials include tantalum, molybdenum, tungsten, and alloys thereof.

The ring is preferably a complete ring although it may also be possible to use a segmented ring comprising a plurality of arcuate segments. Advantageously, the ring has a sloped outer surface 502, for example, at an angle of between 20° and 80°, more preferably 40 to 60°, relative to a central axis of the ring. It has been found that if the ring has a wide top section this can decrease total delivered power density. As such, the width of a top portion of the ring may be equal to or less than 5 mm, 3 mm or 2 mm. In one configuration, the ring may be formed of a 1 mm wide vertical tantalum strip. However, it is desirable that a lower portion of the ring has a greater width to absorb power and heat up to approximately diamond growing temperature. As such, the angled cross-sectional arrangement as illustrated and described above is preferred. The temperature of the ring can be kept hot by ensuring that the contact area of the ring with the substrate holder is small, e.g. the majority of a lower surface of the ring may be spaced apart from the substrate holder and/or base of the chamber. A gap of approximately 0.5 mm under the ring may thus be provided so there is little thermal conduction between the ring and the surface over which the ring is disposed.

The temperature modifying ring performs two roles: it moves the ring of high electric field away from the substrate edge; and, being a separately heated (by plasma) and cooled (by the chamber base) item, it directly modifies the substrate edge temperature. As such, the ring can function to cool the edge of the substrate, reducing the magnitude of any tensile stresses, making cracking of the CVD diamond less likely.

In light of the above, it will be evident that use of such a ring structure mounted on the substrate holder around the substrate can be advantageous for use in combination with embodiments of the present as previously described. The advantageous effects of such a ring structure may also be evident with alternative plasma reactor arrangements.

Even when utilizing arrangements such as those described above, a number of problems may still exist, although these may be substantially alleviated by the previously described arrangements. For example, in some instances there may still be issues of non-uniform CVD diamond growth across the substrate, diamond wafer delamination from the substrate during CVD diamond growth, and crack initiation and/or propagation during cooling after growth of the CVD diamond wafer, particularly when larger substrates are used for growing large area polycrystalline diamond discs (e.g. 80 mm diameter or more) or when growing a plurality of single crystal diamonds in a single growth run on a plurality of single crystal diamond substrates adhered to a supporting substrate over a relatively large area (e.g. 80 mm diameter or more). This is particularly problematic as there is an on going need to increase the area over which high quality, uniform CVD diamond can be grown. Furthermore, these problems tend to be exacerbated when the substrates are reused in subsequent growth runs. This is particularly problematic for refractory metal substrates which are expensive and reuse is desirable in an economically competitive industrial process.

One possible solution considered by the inventors was that the quality of the growth surface was in some way affecting the release of a CVD diamond wafer on cooling after growth thus causing cracking. However, it was found that processing the growth surface to have a more precisely defined flatness and roughness did not in itself solve the problems. After much research focussed at addressing these issues, the present inventors have surprisingly found that the problems they have observed are a result of small variations in temperature across the growth surface of the substrate caused by very minor variations in the height of the gas gap under the substrate. In particular, the present inventors found that although the cylindrical refractory metal substrates provided by their supplier have nominally planar front and rear surfaces, these surfaces are not sufficiently flat. Minor flatness variations in a rear surface of the substrate result in minor variations in the height of the gas gap and it has been found that this results in differential cooling across the substrate. The temperature variations caused by the variations in the gas gap height result in stress variations in the CVD diamond on cooling after CVD diamond growth which can cause the diamond wafer to crack in at least a proportion of growth runs resulting in reduced yields.

While the previously described arrangements can control variations in temperature which are circumferentially symmetric, it can be more difficult to control temperature variations which are not circumferentially symmetric such as those caused by variations in the gas gap height. For example, refractory metal substrates tend to sag and buckle during use (despite being a long way from their melting point). Uniform sag mainly modifies Tc–Te which can be controlled as previously described. However, buckling introduces non-uniformities in the temperature around the wafer edge which are not symmetric. Therefore it is not easy to maintain the whole edge in compression. Typical buckling magnitudes can be greater than 20 micron (peak to valley). For a gas gap of approximately 200 microns, this corresponds to a 10% variation in thickness, and corresponding temperature variation. This can result in up to 60° C. variations in temperature around the wafer edge.

In order to solve this problem, the present inventors found that it is advantageous to ensure that the height h of the gas gap varies by no more than 200 μm, 150 μm, 100 μm, 80 μm, 60 μm, 40 μm, 20 μm, 10 μm, or 5 μm. This may be achieved, for example, by further processing the rear surface of substrates provided by suppliers to have a very precisely defined profile which is complementary to the profile of the supporting surface of the substrate holder. For example, if the supporting surface of the substrate holder is flat, then the rear surface of the substrate should be processed to ensure that it is very precisely flat.

Accordingly, control of rear surface substrate shape by mechanical means (preferably uniform, non-directional processing, e.g. lapping rather than grinding) has been found to be advantageous. Furthermore, the supporting surface of the substrate holder may also be processed to have a precisely defined profile which is complementary to the rear surface of the substrate. Most conveniently this is flat, although other shapes can be used so long as the profile of the supporting surface of the substrate holder and the rear surface of the substrate are complementary so as to maintain a very precisely defined gas gap height. Furthermore, it is possible to intentionally profile at least a portion of the supporting surface of the substrate or the rear surface of the substrate to provide a controlled variation in the height of the gas gap, for example to have a smaller gas gap around the periphery of the substrate to preferentially cool the peripheral region and/or to provide electric field modifying structures. Accordingly, the height h of the gas gap may vary by no more than 200 μm, 150 μm 100 μm, 80 μm, 60 μm, 40 μm, 20 μm, 10 μm or 5 μm across at least a central region of the substrate having a centred diameter equal to or greater than 60%, 70%, 80%, 90%, 95%, or 99% of a total diameter of the substrate. Furthermore, the gas gap may have a central region with a first gas gap height and a peripheral region with a second gas gap height, the first gas gap height being larger than the second gas gap height.

The aforementioned discussion also explains why problems of diamond wafer cracking are exacerbated by substrate re-use. The substrate can buckle during a CVD diamond growth run and therefore lose flatness. As such, it has been found to be advantageous to re-process the substrate between uses to regain the desired surface profile. As the thickness of the substrate will be reduced by such reprocessing, the substrate holder height may be varied to ensure that in subsequent growth runs the growth surface of the substrate remains at the optimum height.

Similarly, the supporting surface of the substrate holder may also be re-processed between growth runs to maintain the desired profile, although it has been found that buckling of this surface is less of a problem than variations forming in the substrate. To enable the supporting surface of the substrate holder to be readily re-processed it is desirable to configure the chamber design such that the substrate holder can readily be removable, measured to determine flatness of the supporting surface, re-processed if necessary to maintain supporting surface flatness, and replaced in the plasma chamber.

In light of the above, one method for reusing the same substrate for a number of synthetic diamond growth runs involves adjusting a height of the substrate within the reactor, when necessary, between synthetic diamond growth runs to account for material removed from the substrate and/or substrate holder by re-processing and maintain a substantially constant height of the growth surface during subsequent synthetic diamond growth runs. The height of the growth surface may be maintained within 2 mm, 1 mm, 0.8 mm, 0.5 mm, 0.3 mm, or 0.2 mm of a target height for the growth surface of the substrate within the reactor. This method may be used to extend the life of substrates which get reprocessed between runs, and therefore become thinner, while maintaining the growth surface at an optimum height for CVD diamond growth within the reactor as previously discussed. The height of the growth surface may be adjusted by providing a substrate holder which is adjustable in height. Alternatively, if a fixed height substrate holder is used, once the substrate thickness has gone below a thickness tolerance band as defined numerically above, the substrate holder can be changed to one with a step matching the diameter of the substrate to take the growth surface height back into its tolerance band. While an adjustable height substrate holder may seem the better option in principle, in practice fixed height substrate holders can be more reliable in achieving accurate and reproducible location of the substrate growth surface within a plasma reactor while simplifying the reactor configuration to have less movable parts.

In light of the above, a second aspect of the present invention provides a substrate suitable for use in the previously described microwave plasma reactors, the substrate comprising:

a cylindrical disc of a carbide forming refractory metal having a flat growth surface on which CVD diamond is to be grown and a flat supporting surface opposed to said growth surface, wherein the cylindrical disc has a diameter of 80 mm or more, wherein the growth surface has a flatness variation no more than 100 μm, and wherein the supporting surface has a flatness variation no more than 100 μm.

In addition to the above, the present inventors have also found that some cylindrical refractory metal substrates provided by suppliers do not result in uniform, high quality CVD diamond wafers, even if both front and rear surfaces were processed as outlined above. After much further research focussed at addressing this issue, the present inventors again found that the problem lay in the quality of the substrate. In particular, the inventors found that commercially available refractory metals often contain small amounts of graphite forming impurities such as iron and nickel. Even very small proportions of such impurities have been found to affect CVD diamond growth on the growth surface of such a substrate. Accordingly, the present inventors found that in addition to applying the precise processing of both front and rear surfaces of the substrate as previously described, it is advantageous to use a carbide forming refractory metal substrate which has very high chemical purity with less than 0.1% graphite forming impurities, at least at the growth surface of the substrate.

Figure 7:
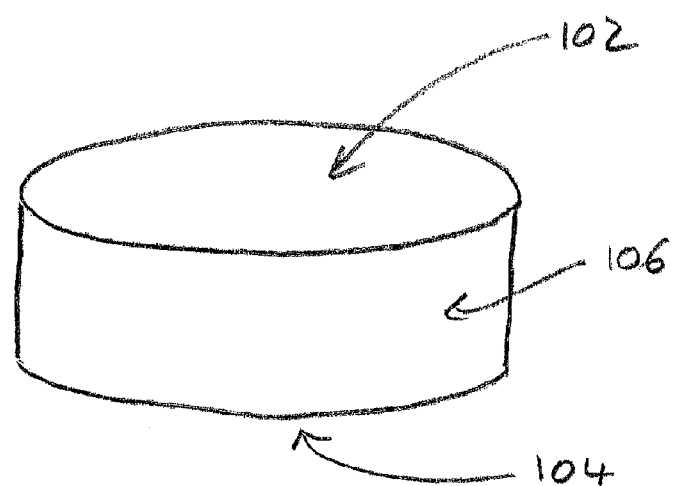
FIG. 7 shows a substrate according to an embodiment of the present invention.

FIG. 7 illustrates such a substrate. The substrate comprises a front growth surface 102, a rear supporting surface 104, and a cylindrical side wall 106. The substrate is formed of a solid body of carbide forming refractory metal. Optionally, the carbide forming refractory metal is selected from one of molybdenum, tungsten, niobium, or alloys thereof. The cylindrical disc preferably comprises no more than 0.5%, 0.1%, 0.075%, 0.05%, 0.025%, 0.01%, 0.005%, or 0.001% by weight of graphite forming impurities at the growth surface of the substrate. The cylindrical disc is most preferably formed of at least 99%, 99.5%, 99.9%, 99.95%, or 99.99% by weight of a carbide forming refractory metal (this may consist of a single carbide forming refractory metal or an alloy of carbide forming refractory metals, e.g. an alloy of tungsten and molybdenum). Of course, while no impurities would be ideal, some very minor impurity levels may still usually exist depending on the limits of the process for manufacturing and processing the carbide forming refractory metal and the cost of obtaining more pure material. Accordingly, a lower limit of 0.01 ppm (parts-per million) by weight of graphite forming impurities at the growth surface may be applied in practice.

According to embodiments of the present invention the flatness variation of the growth surface and the supporting surface of the substrate may be as low as possible. For example, the flatness variation of the growth surface and/or supporting surface may be no more than 75 μm, 50 μm, 40 μm, 30 μm, 20 μm, 10 μm, 5 μm, or 1 μm. Of course, while no flatness variations would be ideal, some very minor variations will still usually exist depending on the limits of the surface processing techniques used to remove flatness variations and the processing time required to achieve a better flatness which will have cost implications in an industrial process. Accordingly, a lower limit for the flatness variations of 0.001 μm or 0.01 μm may be applied.

Optionally, the diameter of the cylindrical disc is in a range as previously described in relation to the first aspect of the invention. It has been found that CVD diamond wafers can be successfully grown over substrates falling within these ranges without any substantial cracking of the wafers occurring on cooling and release of the wafer from the substrate after growth. It should be noted that by "cylindrical disc", we also intend to include discs which are approximately cylindrical, e.g. having a cross section within a circularity of ±10 mm, 5 mm, or 1 mm of a mean circumference. We also intend to cover edge modifications such as chamfered edges and grooves as well as cutting errors.

Optionally, for a microwave plasma reactor with an operating frequency of 400 to 500 MHz, the cylindrical disc may have a depth in a range 10 mm to 30 mm or 15 mm to 25 mm. Alternatively, for a microwave plasma reactor with an operating frequency in the range 800 to 1000 MHz, the cylindrical disc may have a depth in a range 5 mm to 15 mm or 7 mm to 13 mm. Alternatively still, for a microwave plasma reactor with an operating frequency of 2300 to 2600 MHz, the cylindrical disc may have a depth in a range 2.0 mm to 5.5 mm or 2.5 mm to 4.5 mm. The depth of the substrate has been found to be important as the CVD diamond growth process is very sensitive to the height of the growth surface relative to a mean height of the surrounding surface within the plasma chamber as previously described.

Optionally, the growth surface has a surface roughness $R_a$ in the range 1 nm to 1 μm. It has been found that the roughness of the growth surface can affect both the crystal structure of the CVD diamond grown thereon and adhesion strength of the CVD diamond to the substrate. The best specific surface roughness for CVD diamond growth will, to some extent, depend on the type of CVD diamond material which is desired. However, it has been found that a surface roughness $R_a$ in the range 1 nm to 1 μm has been found to be particularly useful to provide sufficient adhesion to the CVD diamond during growth to prevent early delamination during growth while providing a sufficiently low adhesion such that the diamond material can be released from the substrate on cooling after CVD growth without the material cracking. The specific surface roughness selected may depend on the type of CVD diamond material to be grown. Accordingly, the preferred range of surface roughness may be 1 nm to 500 nm, 10 nm to 500 nm, 10 nm to 200 nm, 10 nm to 100 nm, 10 nm to 50 nm, 20 nm to 100 nm, or 50 nm to 100 nm. For example, for thin (less than 500 micron thick) CVD diamond wafers, a target surface roughness of approximately 10 nm $R_a$ may be used. For thicker CVD diamond wafers (500-5000 micron thick) a higher target value in the range 10 nm to 200 nm $R_a$ may be used.

For single crystal diamond growth where single crystal diamond substrates are mounted on the refractory metal substrate prior to deposition, a surface roughness of 100 nm to 500 nm may be provided prior to attachment of the single crystal substrates and subsequent CVD growth thereon. The surface roughness, flatness and temperature of an underlying metallic substrate on which single crystal diamond substrates are mounted is important, despite the fact that the single crystal CVD material grows on the single crystal diamond substrates rather than directly onto the underlying metallic substrate which supports the single crystal diamond substrates. This is because during single crystal diamond growth, polycrystalline diamond material grows over the underlying supporting substrate between the single crystals. If this polycrystalline diamond material delaminates during CVD diamond growth then the growth run can be disrupted. Furthermore, if this polycrystalline diamond material cracks on cooling this can lead to cracking of the single crystal diamond material embedded therein. As such, the issues relating to growth of polycrystalline wafers can also apply to growth of single crystal material. In this regard, when we talk about a substrate and a substrate growth surface in the context of the present invention we mean the underlying substrate rather than single crystal substrates which are mounted thereon for single crystal CVD diamond growth. This underlying substrate is sometimes known as a substrate carrier because it carriers further single crystal diamond substrates thereon. Furthermore, when we talk about the temperature of the growth surface of the substrate we mean the temperature of the growth surface of the underlying substrate rather than the temperature of the growth surface of the single crystal diamond substrates.

Typically, the refractory metal discs are first lapped on a cast iron wheel using diamond grit suspended in a lapping fluid. In general, the lapping process is used for bulk material removal and also to achieve the required flatness for the given process. There are a few processes where the as-lapped surface is used. A typical $R_a$ value for the lapped finish is 100 nm to 500 nm. However, usually the lapped surface is then further processed using, for example, a grinding/polishing machine and using a finer grit to obtain a lower surface roughness value. Prior to CVD diamond growth, the refractory metal substrates may be cleaned to ensure all contamination from the lapping process has been removed and/or seeded to aid nucleation for diamond growth thereon.

While lapping and polishing techniques are known in the art, in accordance with embodiments of the present invention the correct techniques, in the appropriate combination, are selected for a particular CVD diamond product taking into account not only the desired surface finish for the CVD diamond product but also ensuring that the correct amount of flatness and adhesion is provided so that the CVD diamond product will release from the refractory metal substrate on cooling after CVD diamond growth without cracking.

Figure 8:
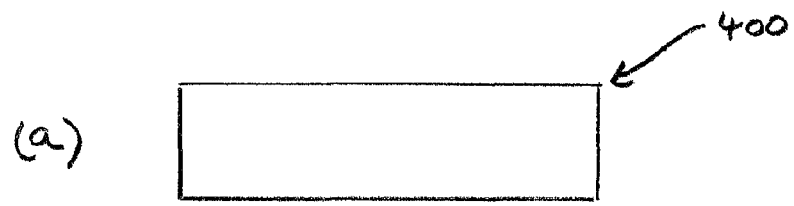
FIGS. 8(a) to 8(d) show various possible alternative substrate configurations.
Figure 8:
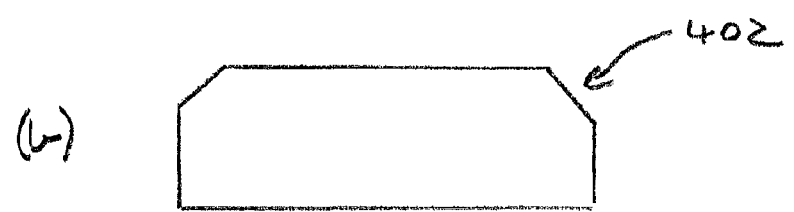
Figure 8:
Figure 8:
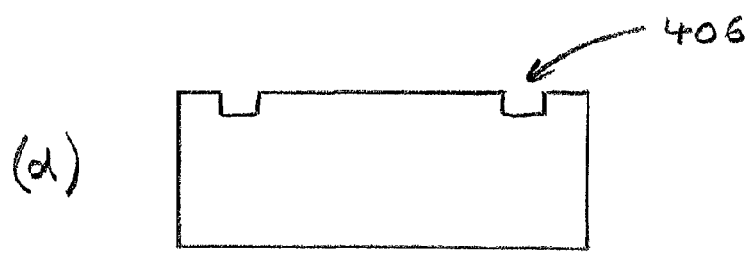

Further modifications may be made to the substrate in order to control cracking and release of CVD diamond material grown thereon. FIGS. 8(a) to 8(d) show various possible substrate configurations. FIG. 8(a) illustrates a cylindrical substrate having a sharp upper edge 400 around the growth surface. FIGS. 8(b) and 8(c) show modified embodiments in which the upper edge is chamfered 402 or rounded 404. These modifications are based on the premise that it is much easier to extend an existing crack, than to initiate a new one (Griffith fracture criterion). The majority of wafer cracks in diamond extend from an edge of the disc. Therefore if small radial cracks can be minimised, there is more chance of obtaining a crack free wafer. The main origin of these is a side-effect of the optimised substrate height. There is a local region of higher electric field around the edge of the substrate, resulting in higher edge temperatures during growth. Therefore the CVD diamond wafer has an edge in tension, making it more likely to fracture during cooling. This tensile region can be managed or mitigated by chamfering or rounding an upper edge of the substrate. A further possible modification is to provide a circular trench 406 around the periphery of the growth surface as illustrated in FIG. 8(d). The trench 406 separates an edge of the substrate growth surface from a central region. This arrangement can yield a fracturable diamond rim such that the central region forms a crack-free CVD diamond wafer.

The substrate may be located within the plasma chamber and spaced apart from the supporting surface by spacer elements as previously described in accordance with embodiments of the first aspect of the invention. The ideal gas gap for a particular growth run will depend on the power density and/or growth temperature utilized. Where the power densities are lower and/or the growth temperature of the substrate is higher, the flatness tolerance can be relaxed, and the gas gap can be made larger, e.g. a 500 micron gas gap can accept up to 50 micron non-flatness and still result in a sufficiently uniform temperature/stress distribution to achieve high yield wafers. For hotter growth, an increase in tolerance to non-uniformities in the gas gap can be attributed to a larger radiative component to the cooling, which is not as sensitive to the gap size. When the pressure and/or the power density within the plasma chamber is increased or the growth temperature of the substrate is decreased, the gas gap is made smaller and the uniformity of the gas gap becomes very important. As such, embodiments of the present invention are particularly useful when operating at higher pressure and/or power when substrate tolerances have been found to be very important. For example, the microwave plasma reactor may be operated at a power density in the range 0.05 to 10 W/mm$^2$ or 1 to 5 W/mm$^2$ of the substrate growth surface. Furthermore, the microwave plasma reactor may be operated at a pressure equal to or greater than: 140, 150, 180, or 200 Torr at a microwave frequency in a range 2300 to 2600 MHz; 80, 100, 120, 140, or 160 Torr at a microwave frequency in a range 800 to 1000 MHz; or 30, 40, 50, 60, or 70 Torr at a microwave frequency in a range 400 to 500 MHz. These pressures are for a standard diamond growing plasma, typically containing 1-5% $CH_4$ diluted in hydrogen. Those skilled in the art will recognize that these pressure ranges might be altered should other gases such as oxygen be added to the plasma chamber.

A substrate as described above has been found to be advantageous for use in a method of manufacturing a synthetic diamond film via chemical vapour deposition, particularly in methods which utilize a microwave plasma reactor as described in accordance with the first aspect if this invention. However, in principle the substrate could also be used in other types of CVD diamond reactor.

So far, a microwave plasma reactor has been described in accordance with a first aspect of the present invention and a substrate suitable for use with the microwave plasma reactor has been described in accordance with a second aspect of the present invention. A third aspect of the present invention is concerned with a suitable method of operating a reactor configured for manufacturing synthetic diamond material. The method of the third aspect of the invention is based on the previously described concept of controlling the relative temperature of a central region and a peripheral region of the substrate growth surface so as to ensure that the peripheral region remains at a slightly lower temperature than the central region during CVD diamond growth. As previously described, this has been found to be advantageous to alleviate the problem of cracking of the CVD diamond wafer during cooling and release from the substrate. Thus, according to a third aspect of the present invention there is provided a method of manufacturing synthetic diamond material using a chemical vapour deposition process, the method comprising:

providing a reactor configured for manufacturing synthetic diamond material;

locating a substrate on a substrate holder within the reactor, the substrate comprising a growth surface on which synthetic diamond material is to be grown;

feeding process gases into the reactor; and growing synthetic diamond material on the growth surface of the substrate, wherein the method further comprises:

taking at least two temperature measurements, including one or more measurements in a central region of the growth surface of the substrate and one or more measurements in a peripheral region of the growth surface of the substrate during growth of the synthetic diamond material; and controlling a temperature difference between the central region and the peripheral region of the growth surface of the substrate during growth of the synthetic diamond material based on the at least two temperature measurements, wherein the temperature of the growth surface of the substrate during growth of the synthetic diamond material is controlled to fulfil the condition 5° C.$<T_c-T_e<$120° C., where $T_c$ is a temperature in the central region of the growth surface of the substrate and $T_e$ is a temperature in the peripheral region of the growth surface of the substrate.

This method may advantageously be implemented using a microwave plasma reactor such as a microwave plasma reactor according to the first aspect of the invention. The method may also advantageously be implemented using a substrate according to the second aspect of the invention. That is, all three aspects of the invention are related to the common inventive concept of achieving uniform and consistent CVD diamond products by improving uniformity of deposition while avoiding issues of cracking.

Certain embodiments of the invention involving growing a polycrystalline diamond wafer having a diameter in the range: 165 mm to 415 mm, 185 mm to 375 mm, 205 mm to 375 mm, 205 mm to 330 mm, or 240 mm to 330 mm for a microwave frequency f in the range 400 to 500 MHz; 80 mm to 200 mm, 90 mm to 180 mm, 100 mm to 180 mm, 100 mm to 160, or 115 mm to 160 mm for a microwave frequency f in the range 800 to 1000 MHz; or 30 mm to 75 mm, 33 mm to 65 mm, 37 mm to 65 mm, 37 mm to 58 mm, or 42 mm to 58 mm for a microwave frequency f in the range 2300 to 2600 MHz. The polycrystalline diamond wafer is spontaneously delaminated from the substrate on cooling after the chemical vapour deposition process is completed to yield a free-standing polycrystalline diamond wafer which is substantially crack free over at least a central region thereof, wherein the central region is at least 70%, 80%, 90%, or 95% of a total area of the free-standing polycrystalline diamond wafer, and wherein the central region has no cracks which intersect both external major faces of the free-standing polycrystalline diamond wafer and extend greater than 2 mm in length. The polycrystalline diamond wafer can be grown to a thickness of at least 100 μm, 300 μm, 500 μm, 700 μm, 1.0 mm, 1.2 mm, 1.5 mm, 2.0 mm, or 2.5 mm while still obtaining substantially crack-free spontaneous delamination. Achieving spontaneous delamination for thick, large diameter polycrystalline diamond wafers has proved difficult in the past due to the larger mechanical stresses imparted on the wafer during growth as well as during cooling and delamination. Embodiments of the present invention now enable thick, large diameter polycrystalline diamond wafers to be spontaneously delaminated from a substrate while avoiding the problems of cracking. Accordingly, a fourth aspect of the present invention provides a method of manufacturing synthetic diamond material using a chemical vapour deposition process, the method comprising:

providing a reactor configured for manufacturing synthetic diamond material;

locating a substrate over a substrate holder within the reactor, the substrate comprising a growth surface on which synthetic diamond material is to be grown;

feeding process gases into the reactor; and growing synthetic diamond material on the growth surface of the substrate, wherein the synthetic diamond material is grown to form a polycrystalline diamond wafer having a diameter of at least 120 mm, 140 mm, 160 mm, 200 mm, or 250 mm, and wherein the polycrystalline diamond wafer is spontaneously delaminated from the substrate on cooling after the chemical vapour deposition process is completed to yield a free-standing polycrystalline diamond wafer which is substantially crack free over at least a central region thereof, wherein the central region is at least 70%, 80%, 90%, or 95% of a total area of the free-standing polycrystalline diamond wafer, and wherein the central region has no cracks which intersect both external major faces of the free-standing polycrystalline diamond wafer and extend greater than 2 mm in length.

Polycrystalline diamond wafers according to embodiments may have a diameter no more than 400 mm or 300 mm depending on the particular process utilized. The polycrystalline diamond wafer can be grown to a thickness of at least 1.0 mm, 1.2 mm, 1.5 mm, 2.0 mm, or 2.5 mm while avoiding the problem of cracking during spontaneous delamination from the substrate. Advantageously, for high purity polycrystalline diamond wafers a microwave plasma reactor is utilized. This embodiment allows thick, large area, high purity polycrystalline diamond wafers to be manufactured in an economic manner. As a matter of practice, thicknesses do not usually exceed 10 or 20 mm.

The fourth aspect of the present invention may advantageous be implemented using any one or more of the first to third aspects of the invention described previously. For example, controlling the position of the substrate to generate an electric field profile as described in relation to the first aspect of the invention, using a precisely defined gas gap and a precisely profiled substrate according to the second aspect of the invention, and/or controlling the temperature difference between central and peripheral regions of the growth surface according to the third aspect of the invention allow spontaneous delamination of large, thick diamond wafers while reducing the problem of cracking.

Embodiments of the present invention are capable of providing larger CVD growth areas, better uniformity, better reproducibility, and better yields in terms of the number of diamond wafers which are successfully grown and released from the substrate without cracking. Improvement in uniformity can be measured by one or more of the following parameters: thickness uniformity or a CVD diamond film (across the deposition area); uniformity of one or more quality parameters of the diamond material (e.g. colour, optical properties, electronic properties, nitrogen uptake, boron uptake, and/or boron activation level); in polycrystalline diamond material, uniformity of texture, surface morphology, grain size, etc. . . . ; or in single crystal diamond material where growth takes place on an array of single crystal diamond substrates on a substrate carrier, uniformity of thickness, morphology, edge twinning, lateral growth, etc. . . . , between each single crystal.

While this invention has been particularly shown and described with reference to preferred embodiments, it will be understood to those skilled in the art that various changes in form and detail may be made without departing from the scope of the invention as defined by the appendant claims.

The invention claimed is:

1. A method of manufacturing synthetic diamond material via chemical vapour deposition, the method comprising:
   providing a microwave plasma reactor comprising:
      a microwave generator configured to generate microwaves at a frequency f;
      a plasma chamber comprising a base, a top plate, and a side wall extending from said base to said top plate defining a resonance cavity for supporting a microwave resonance mode between the base and the top plate;
      a microwave coupling configuration for feeding microwaves from the microwave generator into the plasma chamber;
      a gas flow system for feeding process gases into the plasma chamber and removing them therefrom; and
      a substrate holder disposed in the plasma chamber and comprising a supporting surface for supporting a substrate;
   locating a substrate over the supporting surface of the substrate holder, the substrate having a growth surface on which the synthetic diamond material is to be deposited,
   feeding process gases into the plasma chamber; and
   feeding microwaves into the plasma chamber to form a plasma over the growth surface of the substrate and grow synthetic diamond material on the growth surface of the substrate,
   wherein the substrate dimensions and location within the resonance cavity are selected to generate a localized axisymmetric $E_z$ electric field profile across the growth surface in use, the localized axisymmetric $E_z$ electric field profile comprising a substantially flat central portion bound by a ring of higher electric field, the substantially flat central portion extending over at least 60% of an area of the growth surface of the substrate and having an $E_z$ electric field variation of no more than ±10% of a central $E_z$ electric field strength, the ring of higher electric field being disposed around the central portion and having a peak $E_z$ electric field strength in a range 10% to 50% higher than the central $E_z$ electric field strength.

2. The method of claim 1, wherein the substantially flat central portion of the localized axisymmetric $E_z$ electric field profile has an electric field variation of no more than ±8%, 6%, 5%, 4%, 3%, 2%, or 1% of the central $E_z$ electric field strength.

3. The method of claim 1, wherein the ring of higher electric field has a peak $E_z$ electric field strength in a range 10% to 40%, 15% to 30%, or 15% to 25% higher than the central $E_z$ electric field strength.

4. The method of claim 1, wherein the localized axisymmetric $E_z$ electric field profile is calculated at a height above the growth surface of the substrate of:
   4 mm, 6 mm, or 8 mm for a microwave frequency f in a range 400 MHz to 500 MHz;
   2 mm, 3 mm, or 4 mm for a microwave frequency f in a range 800 MHz to 1000 MHz; or
   0.7 mm, 1.0 mm, or 1.5 mm for a microwave frequency f in a range 2300 MHz to 2600 MHz.

5. The method of claim 1,
   wherein a ratio of substrate diameter/height of the growth surface of the substrate above the base of the plasma chamber is in a range 10 to 14, 11 to 13.5, or 11.0 to 12.5.

6. The method of claim 5, wherein the height of the growth surface of the substrate above the base of the plasma chamber is in the range:
   10 mm to 30 mm or 14 mm to 27 mm for a microwave frequency f in the range 400 to 500 MHz;
   5 mm to 15 mm or 7 mm to 13 mm for a microwave frequency f in the range 800 to 1000 MHz; or
   2.0 mm to 5.5 mm or 2.5 mm to 5.0 mm for a microwave frequency f in the range 2300 to 2600 MHz.

7. The method of claim 5, wherein the microwave frequency f in the range 400 MHz to 500 MHz and the substrate diameter and the height of the growth surface of the substrate within the resonance cavity are selected such that:
   if the substrate diameter is in the range 180 mm to 230 mm, the height of the growth surface is in the range 14 mm to 20 mm;
   if the substrate diameter is in the range 230 mm to 270 mm, the height of the growth surface may is in the range 20 mm to 24 mm; or if the substrate diameter is in the range 270 mm to 310 mm, the height of the growth surface is in the range 22 mm to 27 mm.

8. The method of claim 5, wherein the microwave frequency f in the range 800 MHz to 1000 MHz and the substrate diameter and the height of the growth surface of the substrate within the resonance cavity are selected such that:
if the substrate diameter is in the range 90 mm to 110 mm, the height of the growth surface is in the range 7 mm to 10 mm;
if the substrate diameter is in the range 110 mm to 130 mm, the height of the growth surface may is in the range 9.5 mm to 11.5 mm; or
if the substrate diameter is in the range 130 mm to 150 mm, the height of the growth surface is in the range 11 mm to 13 mm.

9. The method of claim 5, wherein the microwave frequency f in the range 2300 MHz to 2600 MHz and the substrate diameter and the height of the growth surface of the substrate within the resonance cavity are selected such that:
if the substrate diameter is in the range 30 mm to 40 mm, the height of the growth surface is in the range 2.5 mm to 3.7 mm;
if the substrate diameter is in the range 40 mm to 48 mm, the height of the growth surface may is in the range 3.5 mm to 4.2 mm; or
if the substrate diameter is in the range 48 mm to 55 mm, the height of the growth surface is in the range 4.0 mm to 4.8 mm.

10. The method of claim 1, wherein the substrate diameter is in the range:
165 mm to 415 mm, 185 mm to 375 mm, 205 mm to 375 mm, 205 mm to 330 mm, or 240 mm to 330 mm for a microwave frequency f in the range 400 to 500 MHz;
80 mm to 200 mm, 90 mm to 180 mm, 100 mm to 180 mm, 100 mm to 160, or 115 mm to 160 mm for a microwave frequency f in the range 800 to 1000 MHz; or
30 mm to 75 mm, 33 mm to 65 mm, 37 mm to 65 mm, 37 mm to 58 mm, or 42 mm to 58 mm for a microwave frequency f in the range 2300 to 2600 MHz.

11. The method of claim 1, wherein a ratio of a resonance cavity diameter/substrate diameter is in the range 1.5 to 5, 2.0 to 4.5, or 2.5 to 4.0, wherein the resonance cavity diameter is measured at a height less than 50%, 40%, 30%, or 20% of a height of the resonance cavity.

12. The method of claim 11, wherein the resonance cavity diameter is measured at a height of the growth surface of the substrate.

13. The method of claim 1, further comprising:
taking at least two temperature measurements using one or more temperature measurement devices, including one or more measurements in a central region of the growth surface of the substrate and one or more measurements in a peripheral region of the growth surface; and
controlling a temperature difference between the central region and the peripheral region of the growth surface of the substrate during CVD diamond growth thereon based on the at least two temperature measurements using a substrate temperature control system.

14. The method of claim 13, wherein the substrate temperature control system is used to control the temperature of the growth surface of the substrate during CVD diamond growth thereon to fulfil the condition: $5° C.<T_c-T_e<120° C.$; $10° C.<T_c-T_e<100° C.$; $10° C.<T_c-T_e<80° C.$; $20° C.<T_c-T_e<80° C.$; or $20° C.<T_c-T_e<60° C.$, where $T_c$ is a temperature in the central region of the growth surface and $T_e$ is a temperature in the peripheral region of the growth surface.

15. The method of claim 13, wherein the central region of the growth surface has an outer diameter no greater than 50%, 40%, 30%, 20%, or 10% of the diameter of the growth surface and the peripheral region of the growth surface has an inner diameter greater than 50%, 60%, 70%, 80%, 90% or 95% of the diameter of the growth surface.

16. The method of claim 1, wherein the substrate is disposed over the supporting surface of the substrate holder and spaced apart by spacer elements to form a gas gap having a height h between the supporting surface of the substrate holder and a rear surface of the substrate, and the microwave plasma reactor further comprising a gas supply system for supplying gas to said gas gap, the spacer elements being configured to define a central gas gap cavity under the substrate in which gas from the gas supply system can pool.

17. The method of to claim 16, wherein the height h of the gas gap is in the range 25 μm to 2000 μm, 50 μm to 1000 μm, 100 μm to 750 μm, 500 μm to 750 μm, 600 μm to 650 μm, 100 μm to 300 μm, or 150 μm to 250 μm.

18. The method of claim 16, wherein the height h of the gas gap varies by no more than 200 μm, 150 μm 100 μm, 80 μm, 60 μm, 40 μm, 20 μm, 10 μm, or 5 μm across at least a central region of the substrate having a centred diameter equal to or greater than 60%, 70%, 80%, 90%, 95%, or 99% of a total diameter of the substrate.

19. A method according to claim 16, wherein the gas gap has a central region with a first gas gap height and a peripheral region with a second gas gap height, the first gas gap height being larger than the second gas gap height.

* * * * *